(12) United States Patent
Qiang et al.

(10) Patent No.: US 11,996,413 B2
(45) Date of Patent: May 28, 2024

(54) THIN FILM TRANSISTOR AND METHOD OF MANUFACTURING THE SAME, DISPLAY SUBSTRATE, AND DISPLAY DEVICE

(71) Applicant: BOE TECHNOLOGY GROUP CO., LTD., Beijing (CN)

(72) Inventors: Zhaohui Qiang, Beijing (CN); Li Qiang, Beijing (CN); Chao Luo, Beijing (CN); Huiqin Zhang, Beijing (CN); Rui Huang, Beijing (CN); Zhi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 17/413,221

(22) PCT Filed: Jun. 9, 2020

(86) PCT No.: PCT/CN2020/095047
§ 371 (c)(1),
(2) Date: Jun. 11, 2021

(87) PCT Pub. No.: WO2020/259273
PCT Pub. Date: Dec. 30, 2020

(65) Prior Publication Data
US 2022/0020780 A1   Jan. 20, 2022

(30) Foreign Application Priority Data

Jun. 26, 2019   (CN) .......................... 201910563193.4

(51) Int. Cl.
*H01L 27/12*   (2006.01)
*H01L 29/423*   (2006.01)
(Continued)

(52) U.S. Cl.
CPC ...... *H01L 27/1222* (2013.01); *H01L 27/1248* (2013.01); *H01L 27/127* (2013.01);
(Continued)

(58) Field of Classification Search
CPC ................................................ H10K 50/00–88
See application file for complete search history.

(56) References Cited

U.S. PATENT DOCUMENTS

| 2015/0076495 A1* | 3/2015 | Miyairi | ............ H01L 29/78642 |
| | | | 257/43 |
| 2016/0358993 A1 | 12/2016 | Liu | |

(Continued)

FOREIGN PATENT DOCUMENTS

| CN | 108010850 | 5/2018 |
| CN | 108198820 | 6/2018 |

(Continued)

OTHER PUBLICATIONS

PCT International Search Report (w/ English translation) for corresponding PCT Application No. PCT/CN2020/095047 mailed on Sep. 10, 2020, 7 pages.

(Continued)

*Primary Examiner* — Evan G Clinton
(74) *Attorney, Agent, or Firm* — Dority & Manning, P.A.

(57) ABSTRACT

A thin film transistor includes a base, a first electrode, an active pattern, a gate insulating layer, a gate and a second electrode. The active pattern includes a first semiconductor pattern, a second semiconductor pattern and a third semiconductor pattern. A material of one of the first semiconductor pattern and the third semiconductor pattern includes a semiconductor material and N-type doped ions, and a material of another of the first semiconductor pattern and the third semiconductor pattern includes the semiconductor material and P-type doped ions. An orthogonal projection of (Continued)

the gate on the base is non-overlapping with an orthogonal projection of the active pattern on the base.

17 Claims, 13 Drawing Sheets

(51) Int. Cl.
　　　*H01L 29/786* 　　(2006.01)
　　　*G02F 1/1362* 　　(2006.01)
　　　*G02F 1/1368* 　　(2006.01)
　　　*H10K 59/121* 　　(2023.01)

(52) U.S. Cl.
　　　CPC .. *H01L 29/42384* (2013.01); *H01L 29/78696* (2013.01); *G02F 1/13624* (2013.01); *G02F 1/1368* (2013.01); *H10K 59/1213* (2023.02)

(56) References Cited

U.S. PATENT DOCUMENTS

| 2017/0110060 | A1 | 4/2017 | Han et al. | |
| 2017/0256654 | A1* | 9/2017 | Yamazaki | H10K 59/00 |
| 2017/0330924 | A1 | 11/2017 | Kim et al. | |
| 2018/0108782 | A1* | 4/2018 | Zhou | H01L 21/3081 |
| 2018/0219073 | A1* | 8/2018 | Zhou | H01L 29/78663 |
| 2018/0301551 | A1* | 10/2018 | Majhi | H01L 29/267 |
| 2019/0067375 | A1 | 2/2019 | Karda et al. | |
| 2019/0067475 | A1 | 2/2019 | Liu et al. | |
| 2021/0359058 | A1* | 11/2021 | Cho | H01L 29/78696 |

FOREIGN PATENT DOCUMENTS

| CN | 109920802 | 6/2019 |
| CN | 110265484 | 9/2019 |

OTHER PUBLICATIONS

Chinese First Office Action (w/ English translation) for corresponding CN Application No. 201910563193.4 issued Mar. 3, 2021, 16 pages.

Chinese Second Office Action (w/ English translation) for corresponding CN Application No. 201910563193.4 issued Nov. 11, 2021, 13 pages.

* cited by examiner

THIN FILM TRANSISTOR AND METHOD OF MANUFACTURING THE SAME, DISPLAY SUBSTRATE, AND DISPLAY DEVICE

CROSS-REFERENCE TO RELATED APPLICATIONS

This application is a national phase entry under 35 USC 371 of International Patent Application No. PCT/CN2020/095047, filed on Jun. 9, 2020, which claims priority to Chinese Patent Application No. 201910563193.4, filed on Jun. 26, 2019, which are incorporated herein by reference in their entirety.

TECHNICAL FIELD

The present disclosure relates to the field of display technologies, and in particular, to a thin film transistor and a method of manufacturing the same, a display substrate, and a display device.

BACKGROUND

In recent years, with the continuous development of liquid crystal displays (LCDs), organic light-emitting diode (OLED) displays, and other display technologies, display products with large-size, high-resolution display panels are coming out one after another.

SUMMARY

In one aspect, a thin film transistor is provided. The thin film transistor includes a base, a first electrode disposed on the base, an active pattern disposed on the first electrode, a gate insulating layer disposed on the active pattern, a gate disposed on the gate insulating layer, and a second electrode disposed on the gate insulating layer. The active pattern includes a first semiconductor pattern, a second semiconductor pattern, and a third semiconductor pattern that are sequentially stacked in a thickness direction of the base. A material of the second semiconductor pattern includes a semiconductor material, a material of one of the first semiconductor pattern and the third semiconductor pattern includes the semiconductor material and N-type doped ions, and a material of another of the first semiconductor pattern and the third semiconductor pattern includes the semiconductor material and P-type doped ions. The first semiconductor pattern is in contact with the first electrode. First via(s) are provided in the gate insulating layer. There is no overlap between an orthogonal projection of the gate on the base and an orthogonal projection of the active pattern on the base. A distance from a surface of the gate proximate to the base to an upper surface of the base is less than or equal to a distance from a surface of the second semiconductor pattern proximate to the base to the upper surface of the base. A distance from a surface of the gate away from the base to the upper surface of the base is greater than or equal to a distance from a surface of the second semiconductor pattern away from the base to the upper surface of the base. The upper surface of the base is a surface of the base proximate to the first electrode. The second electrode is in contact with the third semiconductor pattern through the first via(s).

In some embodiments, the gate includes a first gate portion, and the first gate portion is located at a first side of the active pattern.

In some embodiments, the gate further includes a second gate portion. The second gate portion is located at a second side of the active pattern, and the first side and the second side are two adjacent sides of the active pattern. The first gate portion and the second gate portion form a one-piece structure.

In some embodiments, the gate further includes a third gate portion. The third gate portion is located at a third side of the active pattern, and the first side and the third side are two opposite sides of the active pattern. The first gate portion, the second gate portion and the third gate portion form a one-piece structure.

In some embodiments, the gate further includes a fourth gate portion. The fourth gate portion is located at a fourth side of the active pattern, and the second side and the fourth side are two opposite sides of the active pattern. The first gate portion, the second gate portion, the third gate portion, and the fourth gate portion form a one-piece structure.

In some embodiments, a side of the gate facing the active pattern is in contact with the gate insulating layer.

In some embodiments, the thin film transistor further includes a buffer layer disposed between the first electrode and the base. A groove is disposed in a surface of the buffer layer away from the base, and the first electrode is disposed in the groove.

In some embodiments, the buffer layer includes a first sub-layer and a second sub-layer, and the second sub-layer is disposed on a surface of the first sub-layer away from the base. A second via is provided in the second sub-layer; the second via serves as the groove, and the first electrode is disposed in the second via.

In some embodiments, the thin film transistor further includes an interlayer insulating layer disposed between the gate and the second electrode. A third via is provided in the interlayer insulating layer; the third via is communicated with the first via, and the second electrode is in contact with the third semiconductor pattern through the third via and the first via.

In some embodiments, the gate and the second electrode are disposed in a same layer.

In another aspect, a display substrate having a plurality of sub-pixel regions is provided. The display substrate includes at least one thin film transistor as described above disposed in a sub-pixel region.

In some embodiments, the at least one thin film transistor includes a plurality of first thin film transistors connected in parallel.

In some embodiments, the plurality of first thin film transistors are two first thin film transistors. First electrodes of the two first thin film transistors are disposed in a same layer and electrically connected to each other. Second electrodes of the two first thin film transistors are disposed in a same layer and electrically connected to each other. Gates of the two first thin film transistors are disposed in a same layer and electrically connected to each other.

In some embodiments, the gate of each first thin film transistor includes a first gate portion, a second gate portion, and a third gate portion that form a one-piece structure. The first gate portion, the second gate portion and the third gate portion are located at a first side, a second side and a third side of the active pattern, respectively. The third gate portion of one of the two first thin film transistors serves as the first gate portion of another of the two first thin film transistors.

In some embodiments, the display substrate is an OLED display substrate. The at least one thin film transistor further includes a second thin film transistor, and the plurality of first thin film transistors connected in parallel collectively serve as a driving transistor.

In yet another aspect, a display device is provided. The display device includes the display panel as described above.

In some embodiments, the display device further includes a light-emitting device disposed in the sub-pixel region.

In yet another aspect, a method of manufacturing the thin film transistor is provided. The method includes: forming the first electrode on the base; forming the active pattern on the first electrode, the active pattern including the first semiconductor pattern, the second semiconductor pattern and the third semiconductor pattern that are sequentially stacked, the material of the second semiconductor pattern including the semiconductor material, the material of one of the first semiconductor pattern and the third semiconductor pattern including the semiconductor material and the N-type doped ions, the material of another of the first semiconductor pattern and the third semiconductor pattern including the semiconductor material and the P-type doped ions, the first semiconductor pattern being in contact with the first electrode; forming the gate insulating layer having the first via on the active pattern; forming the gate on the gate insulating layer, there being no overlap between the orthogonal projection of the gate on the base and the orthogonal projection of the active pattern on the base, the distance from the surface of the gate proximate to the base to the upper surface of the base being less than or equal to the distance from the surface of the second semiconductor pattern proximate to the base to the upper surface of the base, the distance from the surface of the gate away from the base to the upper surface of the base being greater than or equal to the distance from the surface of the second semiconductor pattern away from the base to the upper surface of the base, the upper surface of the base being the surface of the base proximate to the first electrode; and forming the second electrode on the gate insulating layer, the second electrode being in contact with the third semiconductor pattern through the first via.

In some embodiments, before forming the first electrode on the base, the method further includes: forming a buffer layer film on the base by a chemical vapor deposition process, and performing a first patterning process on the buffer layer film to form the buffer layer having groove. Forming the first electrode on the base, includes: forming a first conductive film on the buffer layer by a magnetron sputtering process, and performing a second patterning process on the first conductive film to form the first electrode located in the groove.

In some embodiments, after forming the gate and before forming the second electrode, the method further includes: forming the interlayer insulating layer having the third via(s) on the gate by a plasma enhanced chemical vapor deposition process, the third via(s) being communicated with the first via(s), respectively.

BRIEF DESCRIPTION OF THE DRAWINGS

In order to describe technical solutions in the embodiments of the present disclosure or the prior art more clearly, the accompanying drawings to be used in the description of the embodiments or the prior art will be introduced briefly below. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
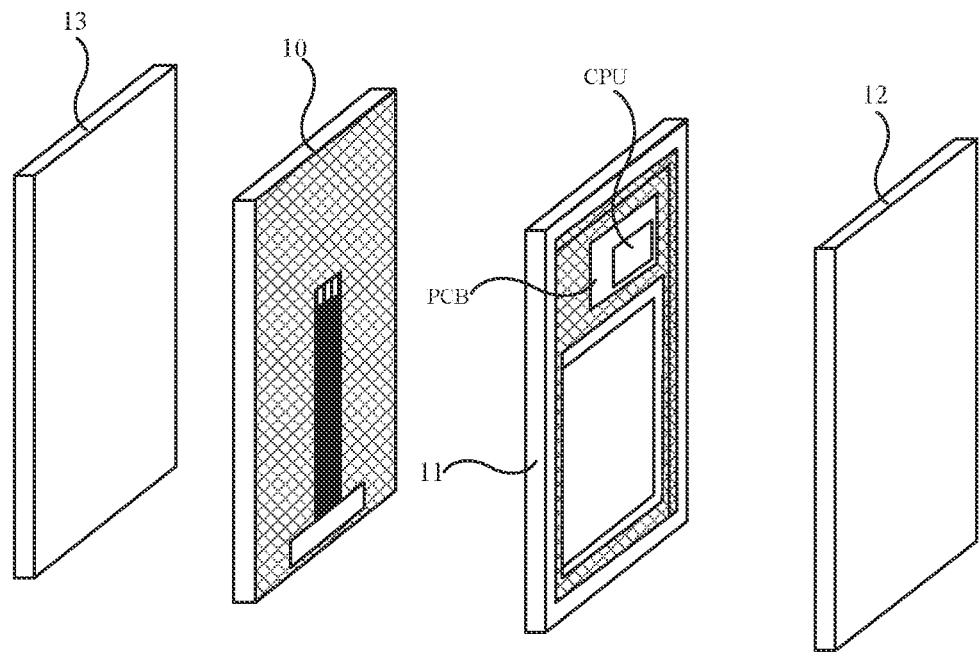
FIG. 1 is a schematic frame diagram of a display device, in accordance with some embodiments of the present disclosure.

Technical solutions in the embodiments of the present disclosure will be described clearly and completely below with reference to the accompanying drawings in the embodiments of the present disclosure. Obviously, the described embodiments are merely some but not all of the embodiments of the present disclosure. All other embodiments obtained on the basis of the embodiments of the present disclosure by a person of ordinary skill in the art without paying any creative effort shah be included in the protection scope of the present disclosure.

Terms such as "first", "second" and similar terms used in the description and the claims of the present disclosure are not intended to indicate any order, quantity or importance, but are merely used to distinguish different components. Therefore, features defined with the terms "first", "second" may include one or more of the features, either explicitly or implicitly. In the description of the embodiments of the present disclosure, the term "a plurality of/the plurality of" means two or more unless otherwise specified.

Orientation terms such as "left", "right", "upper" and "lower" are defined relative to the orientation in which the display device is schematically placed in the drawings. It will be understood that, these directional terms are relative concepts that are used for relative description and clarification, which may change accordingly as the orientation in which the display device is placed changes.

Some embodiments of the present disclosure provide a display device 1. The display device 1 is, for example, a mobile phone, a tablet computer, a personal digital assistant (FDA), a vehicle-mounted computer, etc. The embodiments of the present disclosure do not limit a type of the display device 1.

With the display device 1 being a mobile phone as an example, as shown in FIG. 1, the display device 1 mainly includes a display module 10, a middle frame 11, a casing 12, and a cover plate 13. The display module 10 and the middle frame 11 are disposed in a chamber formed by the casing 12 and the cover plate 13.

The middle frame 11 is located between the display module 10 and the casing 12, and a surface of the middle frame 11 away from the display module 10 is used for installing a battery, a printed circuit board assembly (PCBA), a camera, an antenna, and other internal components. The PCBA may include a printed circuit board (PCB) and a central processing unit (CPU) disposed on the PCB. The cover plate 13 may be, for example, a cover glass (CG).

A light exit surface, from which light exits, of the display module 10 faces the cover plate 13. For example, the display module 10 includes a display panel (DP).

Figure 2:
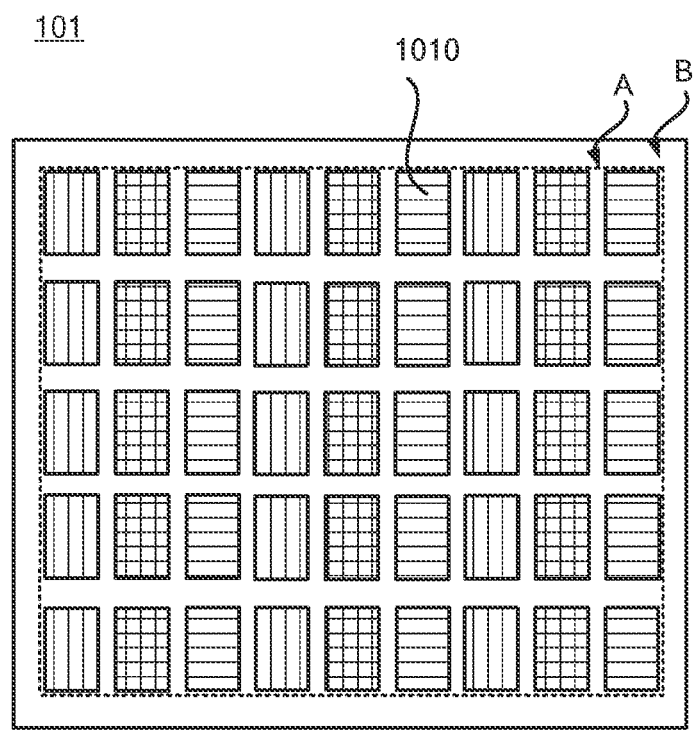
FIG. 2 is a pixel distribution diagram of a display panel, in accordance with some embodiments of the present disclosure.

As shown in FIG. 2, the display panel 101 has a display area A and a peripheral area B. In some examples, the peripheral area B is arranged to surround the display area A. In some other examples, the peripheral area B is only located beside some of the edges of the display area A, for example, located at two opposite sides of the display area A. FIG. 2 illustrates an example in which the peripheral area B is arranged to surround the display area A, but the embodiments of the present disclosure are not limited thereto.

As shown in FIG. 2, the display panel 101 includes a plurality of sub-pixels 1010 disposed in the display area A, and a region where each sub-pixel 1010 is located is a sub-pixel region. The plurality of sub-pixels 1010 include a plurality of first color sub-pixels, a plurality of second color sub-pixels and a plurality of third color sub-pixels. For example, the first color sub-pixel is a red sub-pixel, the second color sub-pixel is a green sub-pixel, and the third color sub-pixel is a blue sub-pixel.

Figure 3A:
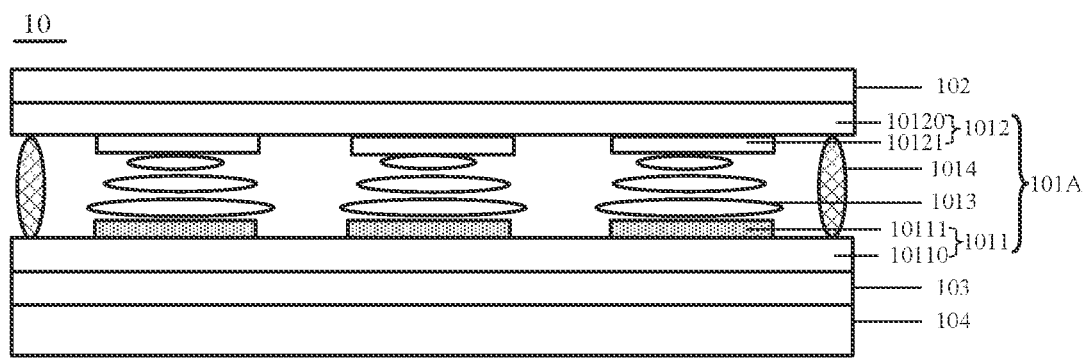
FIG. 3A is a schematic structural diagram of a LCD display module, in accordance with some embodiments of the present disclosure.
Figure 3B:
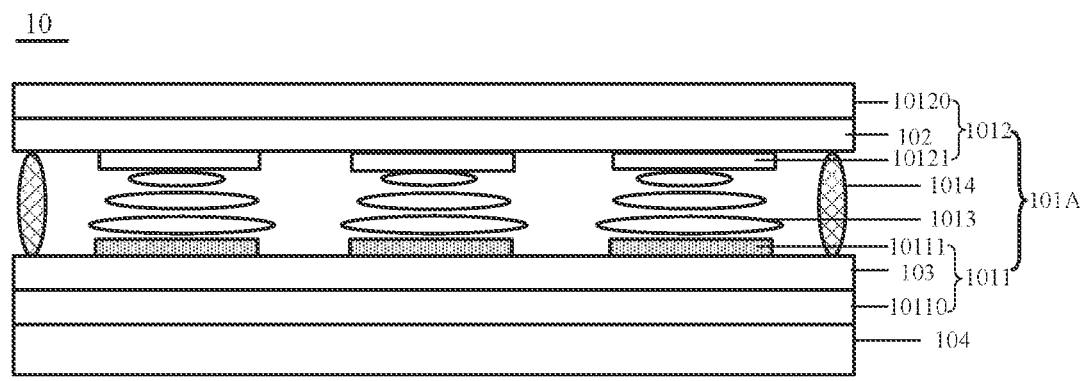
FIG. 3B is a schematic structural diagram of another LCD display module, in accordance with some embodiments of the present disclosure.

In some embodiments, as shown in FIGS. 3A and 3B, the display panel 101 is a liquid crystal display panel 101A. In this case, the display module 10 further includes a backlight module 104 for providing a light source to the liquid crystal display panel.

As shown in FIGS. 3A and 3B, the liquid crystal display panel 101A includes an array substrate 1011 a counter substrate 1012, and a liquid crystal layer 1013 disposed between the array substrate 1011 and the counter substrate 1012. The array substrate 1011 and the counter substrate 1012 are assembled together by a sealant 1014, so that the liquid crystal layer 1013 is confined in a liquid crystal cell enclosed by the array substrate 1011, the counter substrate 1012 and the sealant 1014.

Figure 3C:
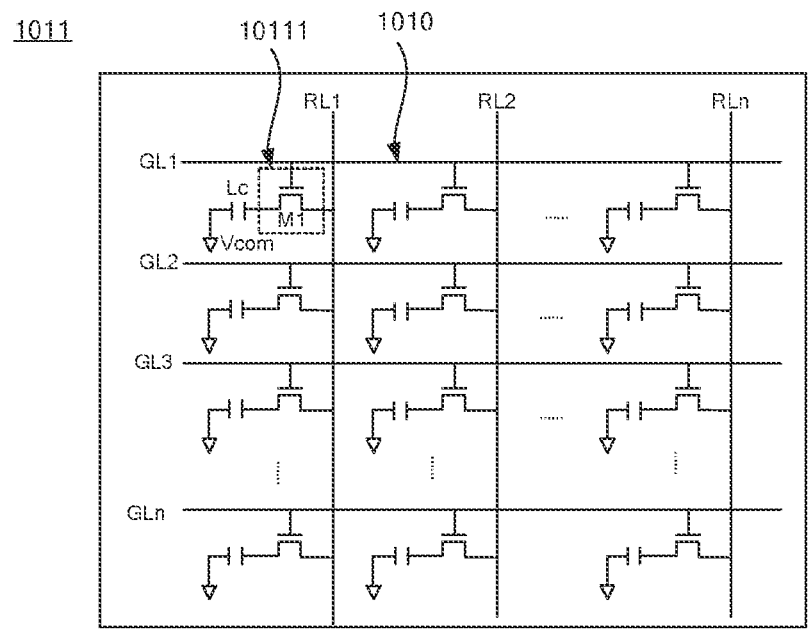
FIG. 3C is an equivalent circuit diagram of pixel circuits, pixel electrodes and common electrodes in a LCD array substrate, in accordance with some embodiments of the present disclosure.

In some examples, as shown in FIGS. 3A to 3C, the array substrate 1011 includes a first base 10110 and a plurality of pixel circuits 10111 disposed on the first base 10110, and each pixel circuit 10111 is located in a corresponding sub-pixel region. The array substrate 1011 further includes pixel electrodes and common electrodes. The pixel circuit 10111 includes a thin film transistor M1, which is electrically connected to the pixel electrode. The common electrodes may also be disposed in the counter substrate 1012. For example, the common electrodes located in all sub-pixel regions form a one-piece structure.

In some examples, as shown in FIGS. 3A and 33, the counter substrate 1012 includes a second base 10120 and a color filter layer disposed on the second base 10120. The color filter layer includes a plurality of filter patterns 10121, and each filter pattern 10121 is located in a corresponding sub-pixel region. The plurality of filter patterns 10121 include a plurality of first color filter patterns, a plurality of second color filter patterns, and a plurality of third color filter patterns. In this case, the counter substrate 1012 is also referred to as a color filter substrate.

An electric field between a pixel electrode and a common electrode located in each sub-pixel region may control a rotation angle of liquid crystal molecules located between the pixel electrode and the common electrode, so as to control a polarization direction of polarized light passing through the liquid crystal molecules.

In some examples, as shown in FIG. 3A, the display module 10 further includes a first polarizing layer 102 disposed on a surface of the second base 10120 facing away from the array substrate 1011 and a second polarizing layer 103 disposed on a surface of the first base 10110 facing away from the counter substrate 1012. The first polarizing layer 102 and the second polarizing layer 103 may both be finished polarizers. In this case, a polarizer used as the first polarizing layer 102 and a polarizer used as the second polarizing layer 103 may be attached to the second base 10120 and the first base 10110, respectively.

In some other examples, as shown in FIG. 3B, the display module 10 further includes a first polarizing layer 102 disposed on a side of the second base 10120 proximate to the array substrate 1011 and a second polarizing layer 103 disposed on a side of the first base 10110 proximate to the counter substrate 1012. The first polarizing layer 102 is a first wire grid polarizing layer (also called grid polarizer (GP)), and the second polarizing layer 103 is a second wire grid polarizing layer. In this case, in the manufacturing process of the counter substrate 1012, the first wire grid polarizing layer is formed on the second base 10120 by sputtering, nanoimprinting, photolithography, or other methods. That is, the first wire grid polarizing layer is integrated into the counter substrate 1012. In the manufacturing process of the array substrate 1011, the second wire grid polarizing layer is formed on the first base by sputtering, nanoimprinting, photolithography, or other methods. That is, the second wire grid polarizing layer is integrated into the array substrate 1011 to form the second polarizing layer 103. Materials of the first wire grid polarizing layer and the second wire grid polarizing layer include a metal conductive material. For example, the metal conductive material includes, but is not limited to, aluminum (Al), copper (Cu), silver (Ag), gold (Au), or chromium (Cr).

A first polarization direction of the first polarizing layer 102 may be perpendicular to a second polarization direction of the second polarizing layer 103. Of course, the first polarization direction of the first polarizing layer 102 may also be parallel to the second polarization direction of the second polarizing layer 103.

The display principle of the display device 1 including the liquid crystal display panel is: the backlight module 104 emits white light, which passes through the second polarizing layer 103 and becomes white polarized light having the second polarization direction. After the white polarized light passes through the array substrate 1011, the liquid crystal layer 1013, and the color filter layer on the counter substrate 1012, light emitted from the red sub-pixels is red polarized light, light emitted from the green sub-pixels is green polarized light, and light emitted from the blue sub-pixels is blue polarized light. Since the liquid crystal molecules in the liquid crystal layer 1013 have an optical rotation effect on polarized light, a specific arrangement direction of the liquid crystal molecules may change the polarization direction of the polarized light emitted from each sub-pixel. Therefore, after the red, green and blue polarized lights pass through the first polarizing layer 102, red, green and blue lights of specific brightness are formed respectively.

For any sub-pixel, in a case where the polarization direction of the polarized light emitted from the sub-pixel is perpendicular to the first polarization direction of the first polarizing layer 102, the polarized light cannot pass through the first polarizing layer 102, and no light is emitted from the sub-pixel.

In a case where the polarization direction of the polarized light emitted from the sub-pixel is parallel to the first polarization direction of the first polarizing layer 102, the polarized light passes through the first polarizing layer 102, and the light emitted from the sub-pixel has a maximum light intensity.

Since the rotation angle of the liquid crystal molecules in each sub-pixel is independently controlled, a brightness of the light emitted from the red sub-pixel, the green sub-pixel or the blue sub-pixel is independently adjustable, Thus, by controlling voltages at the pixel electrode and the common electrode in each sub-pixel, it may be possible to control the amount of light emitted from each sub-pixel that passes through the first polarizing layer 102, so as to control a gray scale of each sub-pixel.

Figure 4A:
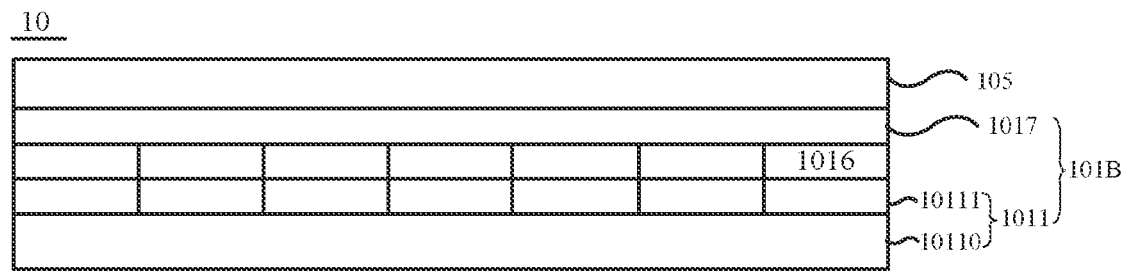
FIG. 4A is a schematic structural diagram of an OLED display module, in accordance with some embodiments of the present disclosure.
Figure 4B:
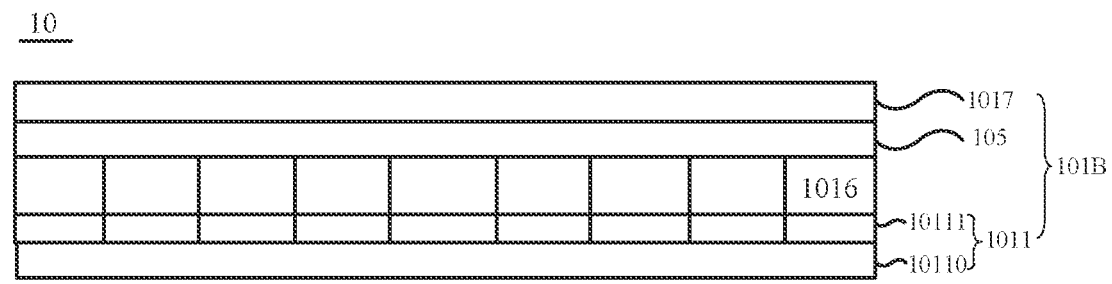
FIG. 4B is a schematic structural diagram of another OLED display module, in accordance with some embodiments of the present disclosure.

In some other examples, as shown in FIGS. 4A and 4B, the display panel 101 is an organic light-emitting diode (OLED) display panel 101B, The OLED display panel 101B is able to emit light by itself, therefore there is no need to provide the BLU in the display module 10.

As shown in FIGS. 4A and 4B, the OLED display panel 101B includes an array substrate 1011. The array substrate 1011 includes a first base 10110 and a plurality of pixel circuits 10111 disposed on the first base 10110. Each pixel circuit 10111 is disposed in a corresponding sub-pixel region. On this basis, the OLED display panel 101B further includes a plurality of light-emitting devices 1016 disposed on the array substrate 1011, and an encapsulation layer 1017 disposed on a side of the plurality of light emitting-devices 1016 away from the array substrate 1011. Each light emitting-device 1016 is disposed in a corresponding sub-pixel region, and is electrically connected to a pixel circuit 10111. The pixel circuit 10111 is used for driving the light-emitting device 1016 to emit light.

Figure 4C:
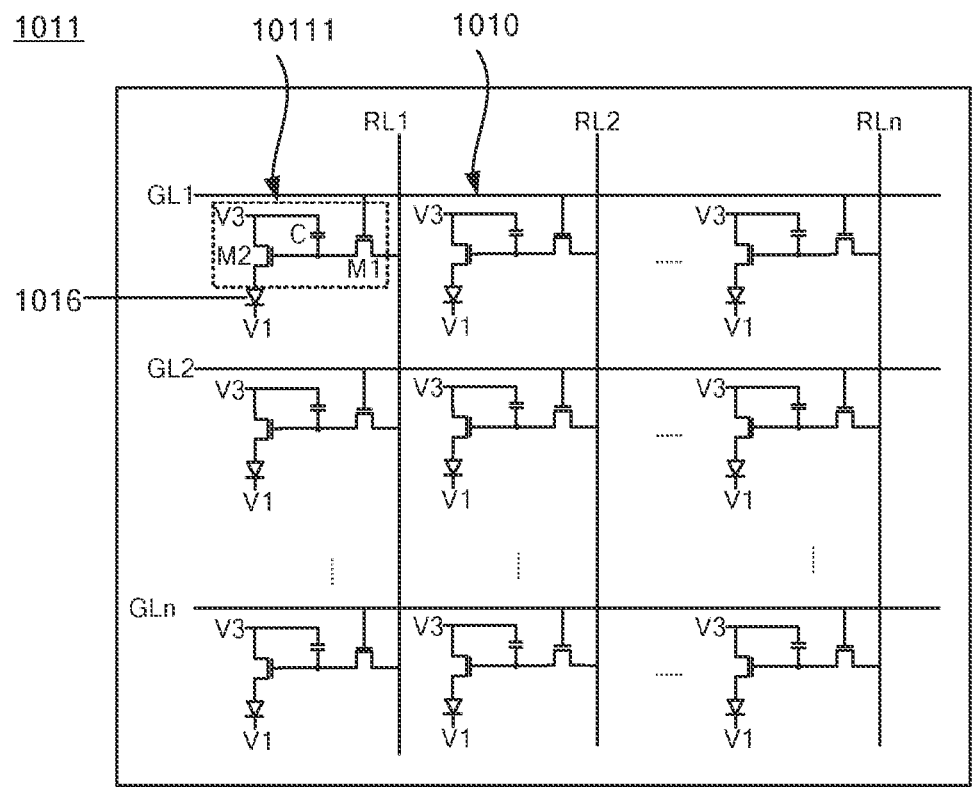
FIG. 4C is an equivalent circuit diagram of pixel circuits and light-emitting devices in an OLED array substrate, in accordance with some embodiments of the present disclosure.

Each pixel circuit 10111 includes at least two thin film transistors. FIG. 4C illustrates an example in which the pixel circuit 10111 includes two thin film transistors (M1 and M2: M1 is a switching transistor, and M2 is a driving transistor), but the embodiments of the present disclosure are not limited thereto.

It will be noted that the OLED display panel 101B may be a flexible display panel or a rigid display panel.

In some examples, as shown in FIG. 4A, the display module 10 further includes a third polarizing layer 105 disposed on a side of the encapsulation layer 1017 away from the first base 10110. In this case, the third polarizing layer 105 may be a finished polarizer. In this case, the polarizer may be attached to the encapsulation layer 1017 of the OLED display panel 101B.

In some other examples, as shown in FIG. 4B, the display module 10 further includes a third polarizing layer 105 disposed between the encapsulation layer 1017 and the light-emitting devices 1016. In this case, the third polarizing layer 105 may be a wire grid polarizing layer, which is integrated into the OLED display panel 101 B. A material of the wire grid polarizing layer includes, but is not limited to, aluminum (Al), copper (Cu), silver (Ag), gold (Au), or chromium (Cr).

The light-emitting principle of the display device 1 including the OLED display panel is: a current applied by the pixel circuit 10111 to the light-emitting device 1016 is controlled such that the light-emitting device 1016 emits a natural light of a specific brightness, and the natural light passes through the encapsulation layer 1017 to form an emergent light. In the meantime, an ambient light passes through the third polarizing layer 105 to form a third polarized light, which is incident into the OLED display panel 101B. The third polarized light is reflected by structure(s) inside the display panel to form a fourth polarized light. A polarization direction of the fourth polarized light is perpendicular to a polarization direction of the third polarized light. Therefore, the fourth polarized light may not be able to exit through the third polarizing layer 105, thereby improving a contrast of the OLED display panel 101B.

It can be seen from the above description that the thin film transistor plays an important role in the display device, and a performance of the thin film transistor determines a performance of the pixel circuit 10111, and thereby determines a light-emitting performance of the display device.

In the related art, in order to achieve a higher resolution and a faster response speed, a transistor with a high carrier migration rate such as a low temperature poly-silicon thin film transistor (LTPS TFT) or a compound TFT (such as gallium nitride TFT) may be used as the thin film transistor of the display device. For example, the LTPS TFT or the compound TFT may be a bottom-gate TFT or a top-gate TFT with LTPS or a compound semiconductor as an active material. However, this kind of LTPS TFT and compound TFT generally have a large leakage current, which may cause a significant increase in power consumption of the display device.

Figure 5:
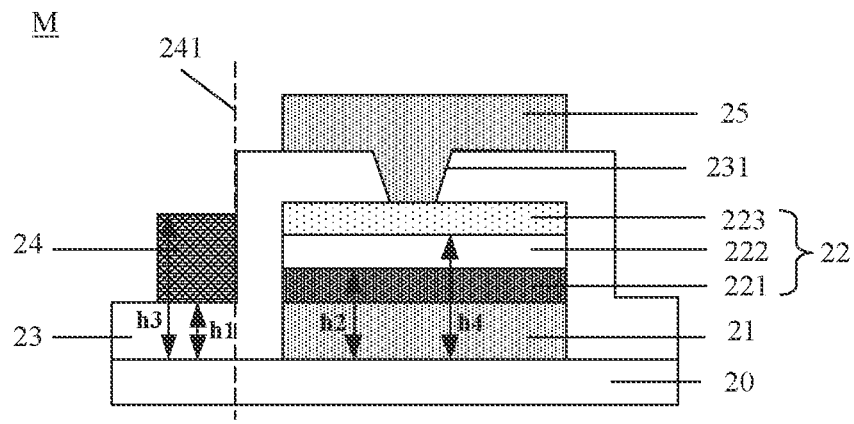
FIG. 5 is a schematic structural diagram of a thin film transistor, in accordance with some embodiments of the present disclosure.

Some embodiments of the present disclosure provide a thin film transistor M. As shown in FIG. 5, the thin film transistor M includes a base 20, a first electrode 21 disposed on the base 20, an active pattern 22 disposed on the first electrode 21, a gate insulating layer 23 disposed on the active pattern 22, and a gate 24 and a second electrode 25 that are disposed on the gate insulating layer 23.

As shown in FIG. 5, the active pattern 22 includes a first semiconductor pattern 221, a second semiconductor pattern 222, and a third semiconductor pattern 223 that are sequentially stacked in a thickness direction of the base 20. The first semiconductor pattern 221 is disposed on a side of the second semiconductor pattern 222 proximate to the base 20, and is in contact with the first electrode 21. The third semiconductor pattern 223 is disposed on a surface of the second semiconductor pattern 222 facing away from the base 20, and is in contact with the second electrode 25.

A material of the second semiconductor pattern 222 includes a semiconductor material, a material of one of the first semiconductor pattern 221 and the third semiconductor pattern 223 includes the semiconductor material and N-type doped ions, and a material of another of the first semiconductor pattern 221 and the third semiconductor pattern 223 includes the semiconductor material and R-type doped ions. For example, the first semiconductor pattern 221 is an N-type doped pattern, and the third semiconductor pattern 223 is a P-type doped pattern. Alternatively, the first semiconductor pattern 221 is a P-type doped pattern, and the third semiconductor pattern 223 is an N-type doped pattern.

The second semiconductor pattern 222 is a semiconductor pattern that is not doped with ions, for example, a semiconductor pattern formed of silicon, germanium, zinc oxide, gallium arsenide, or other materials.

For example, the N-type doped pattern is obtained by patterning a semiconductor film and doping the semiconductor film with pentavalent ions such as phosphorus or nitrogen, so that majority carriers in the N-type doped pattern are electrons. The P-type doped pattern is obtained by patterning a semiconductor film and doping the semiconductor film with trivalent ions such as boron or aluminum, so that majority carriers in the P-type doped pattern are holes.

In some examples, the active pattern 22 is directly disposed on a surface of the first electrode 21 away from the base 20. That is, the first semiconductor pattern 221 is directly disposed on the surface of the first electrode 21 away from the base 20. At least one first via 231 is provided in the gate insulating layer 23, and the second electrode 25 is in contact with the active pattern 22 through the at least one first via 231 in the gate insulating layer 23. That is, the second electrode 25 is in contact with the third semiconductor pattern 223 through the at least one first via 231 in the plate insulating layer 23. Here, the number of the at least one first via 231 may be one or more, which is not limited in the embodiments of the present disclosure.

It will be noted that the shape and size of the first via 231 in FIG. 5 are only for illustration, and the first via 231 may have other shapes and sizes, as long as an orthogonal projection of the first via 231 on the base 20 is located within an orthogonal projection of the third semiconductor pattern 223 of the active pattern 22 on the base 20.

In some other examples, an insulating layer having at least one fifth via is further provided between the active pattern 22 and the first electrode 21. That is, an insulating layer having at least one fifth via is further provided between the first semiconductor pattern 221 and the first electrode 21, and the first semiconductor pattern 221 is in contact with the first electrode 21 through the at least one fifth via in the insulating layer, At least one first via 231 is provided in the gate insulating layer 23, and the second electrode 25 is in contact with the active pattern 22 through the at least one first via 231 in the gate insulating layer 23. That is, the second electrode 25 is in contact with the third semiconductor pattern 223 through the first via 231 in the gate insulating layer 23. Here, the number of the at least one first via 231 and the number of the at least one fifth via may be one or more, which are not limited in the embodiments of the present disclosure.

For example, a material of the gate insulating layer 23 is silicon nitride ($SiN_x$), or silicon oxide ($SiO_2$). A thickness of the gate insulating layer 23 is within a range of 400 nm to 600 nm. For example, the thickness of the gate insulating layer 23 is 400 nm, 500 nm, 550 nm, or 600 nm.

One of the first electrode 21 and the second electrode 25 is a source, and another thereof is a drain.

In some examples, the first electrode 21 and the second electrode 25 are both of a single-layer metal structure. For example, the first electrode 21 includes a molybdenum (Mo) metal layer or a titanium (Ti) metal layer, and the second electrode 25 includes a molybdenum (Mo) metal layer or a titanium (Ti) metal layer. Of course, materials of the first electrode 21 and the second electrode 25 may be the same or different.

In some other examples, the first electrode 21 and the second electrode 25 are both of a multi-layer metal structure. For example, the first electrode 21 includes a titanium (Ti) metal layer, an aluminum (Al) metal layer, and another titanium (Ti) metal layer that are stacked, and the second electrode 25 includes a titanium (Ti) metal layer, an aluminum (Al) metal layer and another titanium (Ti) metal layer that are stacked. Of course, the materials of the first electrode 21 and the second electrode 25 may be the same or different.

As shown in FIG. 5, there is no overlap between an orthogonal projection of the gate 24 on the base 20 and an orthogonal projection of the active pattern 22 on the base 20. In addition, in the thickness direction of the base 20, a distance h1 from a surface of the gate 24 proximate to the base 20 to an upper surface of the base 20 is less than or equal to a distance h2 from a surface of the second semiconductor pattern 222 proximate to the base 20 to the upper surface of the base 20; and a distance h3 from a surface of the gate 24 away from the base 20 to the upper surface of the base 20 is greater than or equal to a distance h4 from a surface of the second semiconductor pattern 222 away from the base 20 to the upper surface of the base 20. The upper surface of the base 20 is a surface of the base 20 proximate to the first electrode 21.

In other words, with a plane where a side of the gate 24 facing the active pattern 22 is located as a reference plane 241 (the reference plane 241 is perpendicular to the base 20), an orthogonal projection of the second semiconductor pattern 222 on the reference plane 241 is located within an orthogonal projection of the gate 24 on the reference plane 241.

Since the first electrode 21 and the active pattern 22 are provided between the gate insulating layer 23 and the base 20, in a first region of the base 20 on which the first electrode 21 and the active pattern 22 are provided, the gate insulating layer 23 is located on the active pattern 22; and in a second region of the base 20 on which the first electrode 21 and the active pattern 22 are not provided, the gate insulating layer 23 is located on the base 20 or on a film layer (e.g., a buffer layer) between the first electrode 21 and the base 20.

The gate 24 is located on a side of the gate insulating layer 23 away from the base 20, which actually means that in the second region, the gate 24 is located on the side of the gate insulating layer 23 away from the base 20. Since the active pattern 22 is located on the first electrode 21, the gate 24 is located on the gate insulating layer 23, and the first electrode 21 and the gate insulating layer 23 both have a certain thickness, it may be considered that the gate 24 and the active pattern 22 are arranged side by side. By arranging that the orthogonal projection of the second semiconductor pattern 222 on the reference plane 241 is located within the orthogonal projection of the gate 24 on the reference plane 241, it may be possible to realize the control of the active pattern 22 by the gate 24.

In the thin film transistor M provided in some embodiments of the present disclosure, a structure of the active pattern 22 of the thin film transistor M is designed in a way that: the second semiconductor pattern 222 is located in the middle; the first semiconductor pattern 221 and the third semiconductor pattern 223 are located on two different sides of the second semiconductor pattern 222 in the thickness direction of the base 20; the orthogonal projection of the gate 24 on the base 20 does not overlap with the orthogonal projection of the active pattern 22 on the base 20; one of the first semiconductor pattern 221 and the third semiconductor pattern 223 is a P-type doped pattern, and another thereof is an N-type doped pattern. In this way, in a case where a voltage is applied to the gate 24, an energy band of the second semiconductor pattern 222 may be changed, so that the energy band of the second semiconductor pattern 222 is flush with an energy band of one of the P-type doped pattern and the N-type doped pattern, and the energy band of the second semiconductor pattern 222 and an energy band of another of the P-type doped pattern and the N-type doped pattern are extremely bent. In the end, a tunneling occurs, and the thin film transistor M is turned on to form a tunneling current.

In a case where no voltage is applied to the gate 24 (that is, the thin film transistor M is in an off state), a potential barrier between the first electrode 21 and the second semiconductor pattern 222 is very large, and a potential barrier between the second electrode 25 and the second semiconductor pattern 222 is also very large. As a result, it is difficult for carriers to pass between the first electrode 21 and the second electrode 25, thereby reducing a leakage current of the thin film transistor M and reducing a power consumption of the thin film transistor M. Therefore, compared to a thin film transistor with a conventional structure (bottom gate or top gate) that has a same channel length, the thin film transistor M provided in some embodiments of the present disclosure has a smaller leakage current, and therefore may be applied to thin film transistors with sub-micron channel design.

In some embodiments, as shown in FIG. 5, the side of the gate 24 facing the active pattern 22 is in contact with the gate insulating layer 23.

In this way, after a voltage is applied to the gate 24, since the gate 24 is in direct contact with the gate insulating layer 23, the gate 24 is closer to the active pattern 22. Therefore, an electric field generated by the gate 24 may be able to control the carriers in the active pattern 22 to form a channel more effectively, thereby improving a switching sensitivity of the thin film transistor M.

Figure 6A:
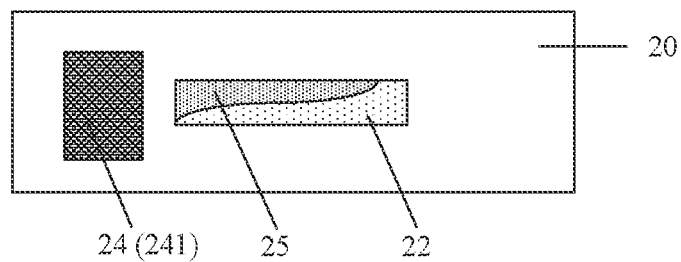
FIG. 6A is a top view of a thin film transistor, in accordance with some embodiments of the present disclosure.

In some embodiments, as shown in FIG. 6A, the gate 24 includes a first gate portion 241. The first gate portion 241 is located at a first side of the active pattern 22. For example, the orthogonal projection of the gate 24 on the base 20 is in a shape of a rectangle.

Figure 6B:
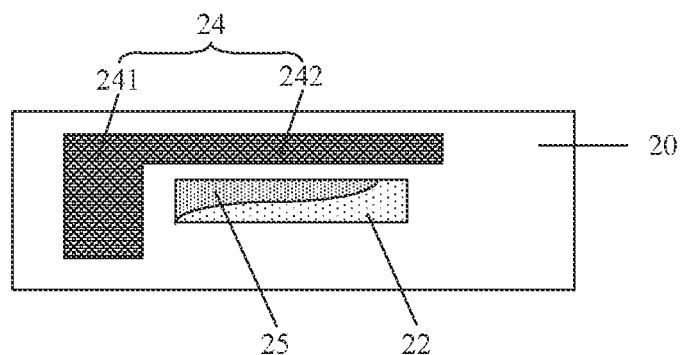
FIG. 6B is a top view of another thin film transistor, in accordance with some embodiments of the present disclosure.

In some other embodiments, as shown in FIG. 6B, the gate 24 includes a first gate portion 241 and a second gate portion 242. The first gate portion 241 is located at a first side of the active pattern 22, and the second gate portion 242 is located at a second side of the active pattern 22, The first side and the second side are two adjacent sides of the active pattern 22. For example, the first gate portion 241 and the second gate portion 242 form a one-piece structure, and the orthogonal projection of the gate 24 on the base 20 is in a shape of a capital letter L.

Figure 6C:
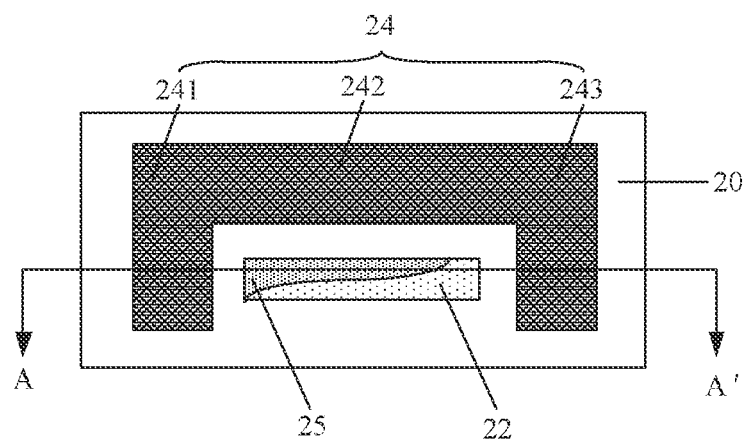
FIG. 6C is a top view of yet another thin film transistor, in accordance with some embodiments of the present disclosure.
Figure 6D:
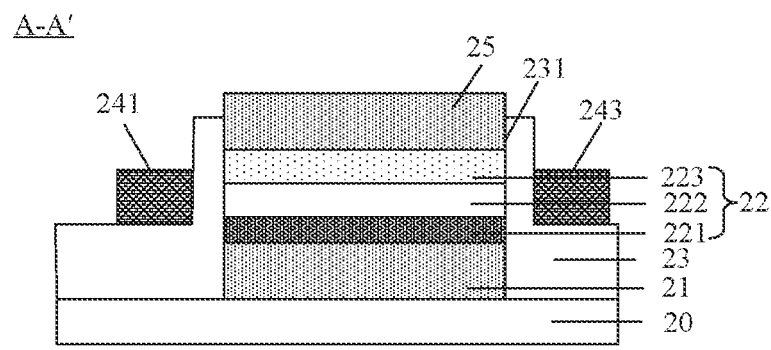
FIG. 6D is a sectional view taken along an A-A' direction in FIG. 6C.

In yet some other embodiments, as shown in FIGS. 6C and 6D, the gate 24 includes a first gate portion 241, a second gate portion 242, and a third gate portion 243. The first gate portion 241 is located at a first side of the active pattern 22, the second gate portion 242 is located at a second side of the active pattern 22, and the third gate portion 243 is located at a third side of the active pattern 22. The first side and the second side are two adjacent sides of the active pattern 22, and the first side and the third side are two opposite sides of the active pattern 22. For example, the first gate portion 241, the second gate portion 242, and the third gate portion 243 form a one-piece structure, and the orthogonal projection of the gate 24 on the base 20 is in a shape of a capital letter "U" or "C".

Figure 6E:
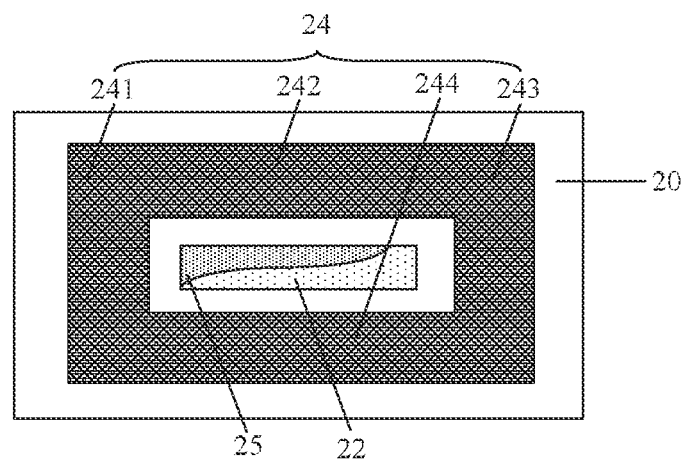
FIG. 6E is a top view of yet another thin film transistor, in accordance with some embodiments of the present disclosure.

In some other embodiments, as shown in FIG. 6E, the gate 24 includes a first gate portion 241, a second gate portion 242, a third gate portion 243 and a fourth gate portion 244. The first gate portion 241 is located at a first side of the active pattern 22, the second gate portion 242 is located at a second side of the active pattern 22, the third gate portion 243 is located at a third side of the active pattern 22, and the fourth gate portion 244 is located at a fourth side of the active pattern 22. The first side and the second side are two adjacent sides of the active pattern 22, the first side and the third side are two opposite sides of the active pattern 22, and the second side and the fourth side are two opposite sides of the active pattern 22. For example, the first gate portion 241, the second gate portion 242, the third gate portion 243, and the fourth gate portion 244 form a one-piece structure, and the orthogonal projection of the gate 24 on the base 20 is in a shape of a Chinese character "回".

In a case where the gate 24 is located at a plurality of sides of the active pattern 22, a driving effect of the gate 24 is equivalent to a driving effect in a case where the thin film transistor M is driven by a plurality of gates. In this way, a driving voltage of the gate 24 may be lowered, which reduces the power consumption.

In some embodiments, the orthogonal projection of the active pattern 22 on the base 20 is located within an orthogonal projection of the first electrode 21 on the base 20. For example, as shown in FIG. 5, the orthogonal projection of the active pattern 22 on the base 20 and the orthogonal projection of the first electrode 21 on the base 20 completely overlap. Based on this, the first electrode 21 and the active pattern 22 may be patterned using the same mask. For another example, the orthogonal projection of the active pattern 22 on the base 20 is located within the orthogonal projection of the first electrode 21 on the base 20, and an area of the orthogonal projection of the active pattern 22 on the base 20 is less than an area of the orthogonal projection of the first electrode 21 on the base 20.

In some embodiments, as shown in FIG. 5, the first electrode 21 is directly disposed on the surface of the base 20. That is, no other layer is disposed between the first electrode 21 and the base 20.

The base 20 may be made of a flexible material or a rigid material.

Figure 7:
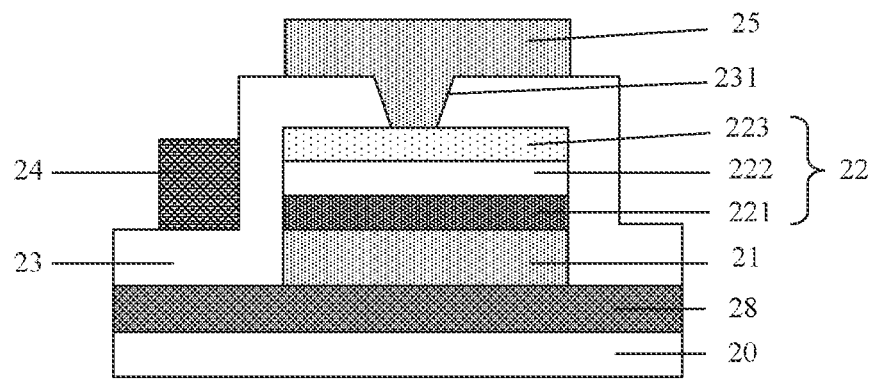
FIG. 7 is a schematic structural diagram of another thin film transistor, in accordance with some embodiments of the present disclosure.

In some other embodiments, as shown in FIG. 7, the thin film transistor M further includes a buffer layer 28 disposed between the first electrode 21 and the base 20.

A material of the buffer layer 28 is an inorganic material such as silicon nitride ($SiN_x$) or silicon oxide ($SiO_2$).

Since the material of the buffer layer 28 has good adhesion on the surface of the base 20, a connection stability between the first electrode 21 and the base 20 may be improved by adding the buffer layer 28 between the base 20 and the first electrode 21. In addition, by providing the buffer layer 28 on the base 20, it may be possible to prevent impurities from entering an inside of the thin film transistor M.

Figure 8:
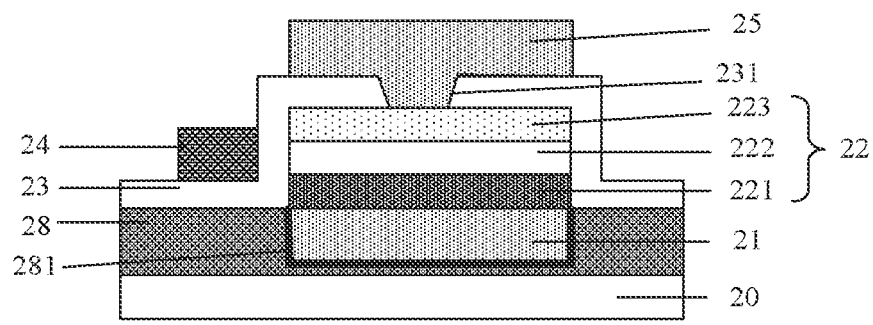
FIG. 8 is a schematic structural diagram of yet another thin film transistor, in accordance with some embodiments of the present disclosure.

In some embodiments, as shown in FIG. 8, a groove 281 is disposed in a surface of the buffer layer 28 away from the base 20, and the first electrode 21 is located in the groove 281. The groove 281 in the buffer layer 28 provides a space for the fabrication of the first electrode 21, so that the first electrode 21 may just be arranged in the groove 281.

For example, an orthogonal projection of the groove 281 on the base 20 basically coincides with the orthogonal projection of the first electrode 21 on the base 20, and the surface of the first electrode 21 facing away from the base 20 is flush with the surface of the buffer layer 28 facing away from the base 20.

In this way, by providing the groove 281 in the buffer layer 28 and by arranging the first electrode 21 in the groove 281, it may be possible to reduce a thickness of the thin film transistor M.

Figure 9:
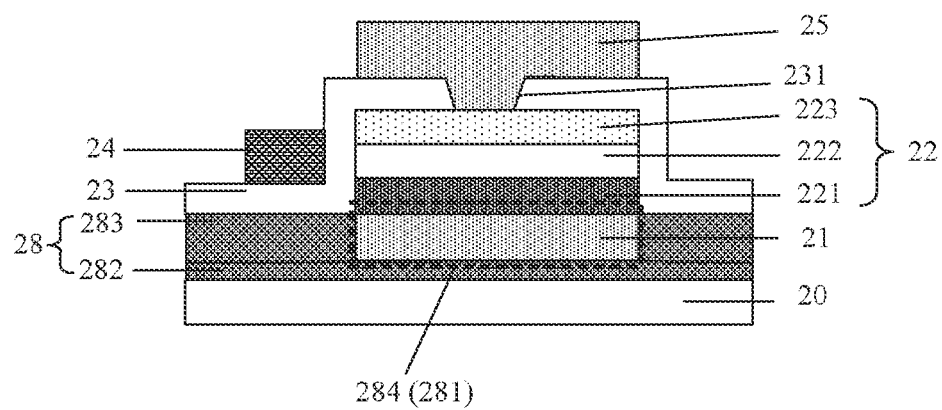
FIG. 9 is a schematic structural diagram of yet another thin film transistor, in accordance with some embodiments of the present disclosure.

In some embodiments, in order to facilitate the formation of the groove 281, as shown in FIG. 9, the buffer layer 28 includes a first sub-layer 282 and a second sub-layer 283. The second sub-layer 283 is disposed on a surface of the first sub-layer 282 away from the base 20. A second via 284 is provided in the second sub-layer 283, and the second via 284 serves as the groove 281.

A material of the first sub-layer 282 may be the same as a material of the second sub-layer 283. Of course, the material of the first sub-layer 282 may be different from the material of the second sub-layer 283, as long as they can be well bonded together. For example, the first sub-layer 282 is a silicon nitride layer with a thickness of 30 nm to 80 nm, and the second sub-layer 283 is a silicon oxide layer with a thickness of 300 nm to 800 nm.

In this way, the first sub-layer 282 may be formed on the base 20 first. Then, after a second sub-layer film is formed, the second sub-layer film is patterned to form a second via 284 in the second sub-layer film, so as to obtain the second sub-layer 283. Based on this, the buffer layer 28 may be fabricated through a conventional fabrication process, and it may be possible to prevent process problems from affecting a shape of the groove 281 and thus affecting a performance of the thin film transistor M when the groove 281 is formed in the buffer layer 28.

In some embodiments, as shown in FIG. 9, the gate 24 and the second electrode 25 are arranged in a same layer. Here, "in the same layer" refers to a layer structure formed by using a same film formation process to form a film layer for forming specific patterns, and then using a same mask plate to pattern the film layer through a single patterning process. The patterning process may include exposure, development and etching processes, and the specific patterns in the formed layer structure may be continuous or discontinuous. These specific patterns may also be at different heights or have different thicknesses.

By arranging the gate 24 and the second electrode 25 in the same layer, it may be possible to simplify the manufacturing process of the thin film transistor M.

Figure 10:
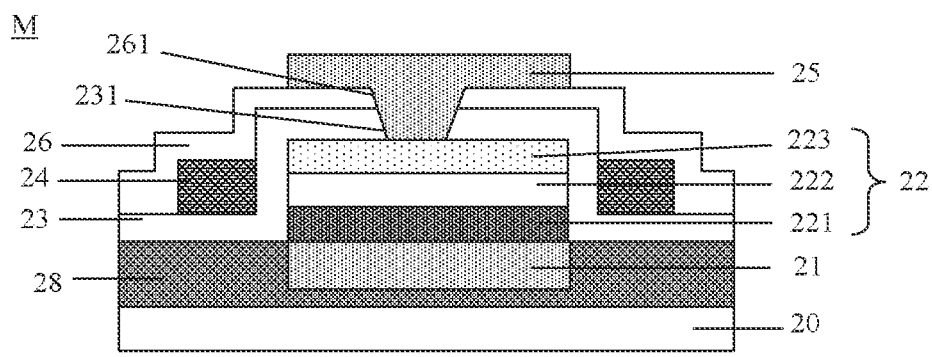
FIG. 10 is a schematic structural diagram of yet another thin film transistor, in accordance with some embodiments of the present disclosure.

In some other embodiments, as shown in FIG. 10, the thin film transistor M further includes an interlayer insulating layer 26 disposed between the gate 24 and the second electrode 25. At least one third via 261 is provided in the interlayer insulating layer 26. The at least one third via 261 is in one-to-one correspondence with the at least one first via 231, and a third via 261 is communicated with a corresponding first via 231. Herein, an orthogonal projection of a third via 261 on the base overlaps with an orthogonal projection of a corresponding first via 231 on the base 20. The second electrode 25 is in contact with the third semiconductor pattern 223 in the active pattern 22 through the third via 261 in the interlayer insulating layer 26 and the first via 231 in the gate insulating layer 23.

For example, a thickness of the interlayer insulating layer 26 is within a range of 100 nm to 300 nm, for example, 100 nm, 150 nm, 200 nm, 250 nm or 300 nm. A material of the interlayer insulating layer 26 is $SiN_x$ or $SiO_2$.

In some embodiments, a material of the active pattern 22 in the thin film transistor M is polysilicon manufactured by a low temperature process.

In some other embodiments, the material of the active pattern 22 in the thin film transistor M is a compound semiconductor, such as zinc oxide (ZnO), or gallium arsenide (GaAs).

Figure 11A:
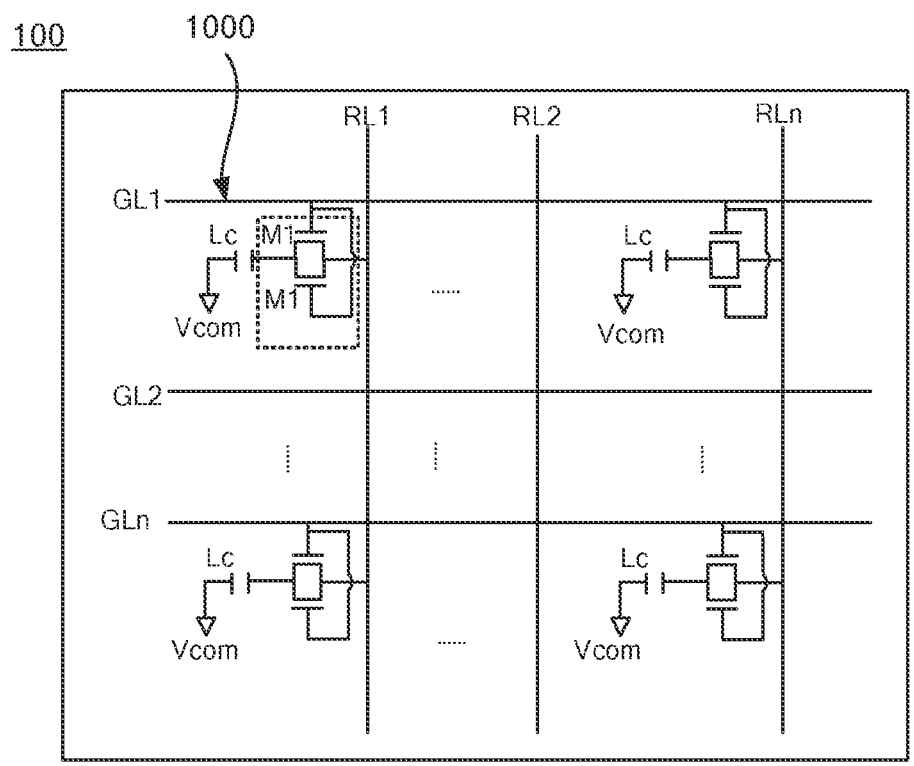
FIG. 11A is a schematic structural diagram of pixel circuits in a display substrate, in accordance with some embodiments of the present disclosure.
Figure 11B:
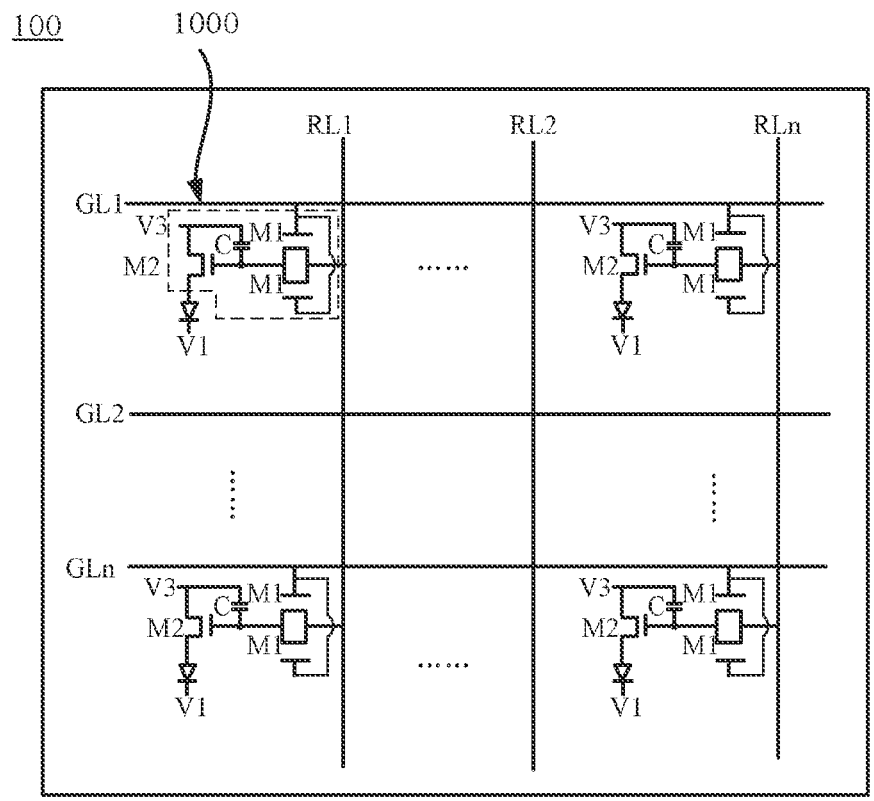
FIG. 11B is a schematic structural diagram of pixel circuits in another display substrate, in accordance with some embodiments of the present disclosure.
Figure 12:
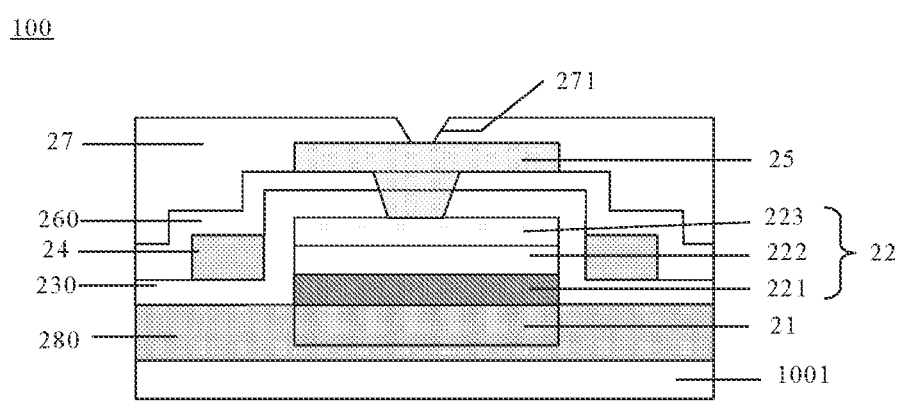
FIG. 12 is a schematic structural diagram of a display substrate, in accordance with some embodiments of the present disclosure.

Some embodiments of the present disclosure provide a display substrate 100. As shown in FIGS. 11A and 11B, the display substrate 100 has a plurality of sub-pixel regions 1000. As shown in FIG. 12, the display substrate 100 includes at least one thin film transistor M as described above disposed in a sub-pixel region 1000. For example, at least one thin film transistor M as described above is provided in each sub-pixel region 1000.

It will be noted that, as for insulating layers such as the gate insulating layer 23, the interlayer insulating layer 26, and the buffer layer 28 in the thin film transistor M, in the display substrate 100, all the gate insulating layers 23 in the thin film transistors M form a one-piece structure, which is also called a one-piece gate insulating layer 230 hereinafter, all the interlayer insulating layers 26 form a one-piece structure, which is also called a one-piece interlayer insulating layer 260, and all the buffer layers 28 in the thin film transistors M form a one-piece structure, which is also called a one-piece buffer layer 280 hereinafter. In addition, as shown in FIGS. 30, 40, 11A, 11B and 13A to 13D, in the display substrate 100, all the bases 20 in the thin film transistors M form a one-piece structure, which is also called base substrate 1001 hereinafter.

In this way, a power consumption of the display substrate 100 may be reduced, and thus the power consumption of the display device 1 may be reduced.

In order to facilitate the fabrication of light-emitting devices 1016 on a side of the thin film transistors M away from the base substrate 1001, as shown in FIG. 12, the display substrate 100 further includes a planarization layer 27 provided on the side of the thin film transistors M away from the base substrate 1001. A plurality of fourth vies 271 are provided in the planarization layer 27. The orthogonal projection of each second electrode 25 on the base substrate 1001 overlaps with orthogonal projection(s) of at least one fourth via 271 on the base substrate 1001. The fourth via 271 is provided so that the light-emitting device 1016 fabricated subsequently can be electrically connected to the second electrode 25 of the thin film transistor M through the fourth via 271.

In some embodiments, as shown in FIGS. 11A, 11B, and 13A to 13E, the at least one thin film transistor M located in the sub-pixel region 1000 includes a plurality of first thin film transistors M1 connected in parallel, and the first thin film transistor M1 has a same structure as the thin film transistor M described above.

By connecting the plurality of first thin film transistors M1 in parallel, an on-state current of an equivalent thin film transistor composed of the plurality of first thin film transistors M1 may be increased.

It will be understood that the number of the first thin film transistors M1 connected in parallel may be determined according to actual needs, which is not limited here.

Figure 13A:
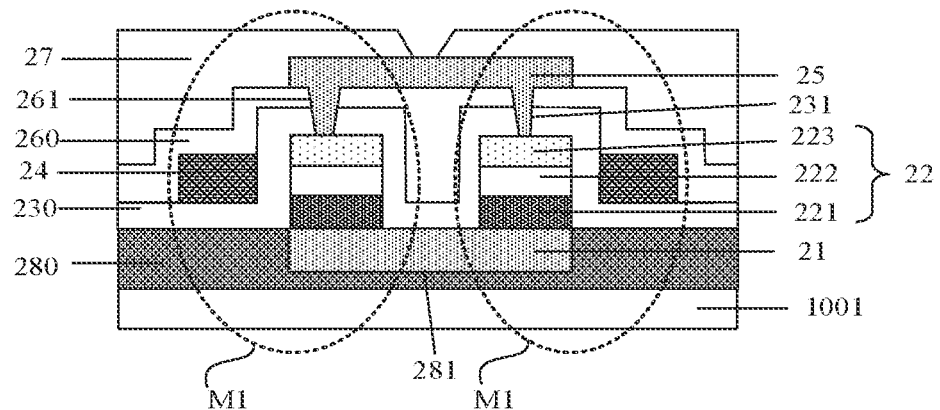
FIG. 13A is a schematic structural diagram of another display substrate, in accordance with some embodiments of the present disclosure.

In some embodiments, as shown in FIG. 13A, the plurality of first thin film transistors M1 connected in parallel are two first thin film transistors M1 connected in parallel. First electrodes 21 of the two first thin film transistors M1 are disposed in a same layer and electrically connected to each other. Second electrodes 25 of the two first thin film transistors M1 are disposed in a same layer and electrically connected to each other. Gates 24 of the two first thin film transistors M1 are disposed in a same layer and electrically connected to each other.

The description that the first electrodes 21 of the two first thin film transistors M1 are disposed in the same layer and electrically connected to each other means that, the first electrodes 21 of the two first thin film transistors M1 are manufactured based on a same conductive film using a same patterning process, and the first electrode 21 of one first thin film transistor M1 is electrically connected to the first electrode 21 of another. The description that the second electrodes 25 of the two first thin film transistors M1 are disposed in the same layer and electrically connected to each other means that, the second electrodes 25 of the two first thin film transistors M1 are manufactured based on a same conductive film using a same patterning process, and the second electrode 25 of one first thin film transistor M1 is electrically connected to the second electrode 25 of another. The description that the gates 24 of the two first thin film transistors M1 are disposed in the same layer and electrically connected to each other means that, the gates 24 of the two first thin film transistors M1 are manufactured based on a same conductive film using a same patterning process, and the gate 24 of one first thin film transistor M1 is electrically connected to the gate 24 of another.

The gates 24 of the two first thin film transistors M1 are electrically connected, the first electrodes 21 of the two first thin film transistors M1 are electrically connected, and the second electrodes 25 of the two first thin film transistors M1 are electrically connected, which is equivalent to a case where the two first thin film transistors M1 are connected in parallel. In this way, the two first thin film transistors M1 connected in parallel receive and transmit electrical signals simultaneously, which is equivalent to a case where the electrical signals are doubled. As a result, the on-state current of an equivalent thin film transistor composed of the two first thin film transistors M1 may be increased, thereby meeting display requirements of the display device 1.

The arrangement that the first electrodes 21 of the two first thin film transistors M1 are electrically connected to each other may be implemented in a way that the first electrodes 21 of the two first thin film transistors M1 form a one-piece structure, or that the first electrodes 21 of the two first thin film transistors M1 are electrically connected to each other through a first conductive structure.

The arrangement that the second electrodes 25 of the two first thin film transistors M1 are electrically connected to each other may be implemented in a way that the second electrodes 25 of the two first thin film transistors M1 form a one-piece structure, or that the second electrodes 25 of the two first thin film transistors M1 are electrically connected to each other through a second conductive structure.

Figure 13B:
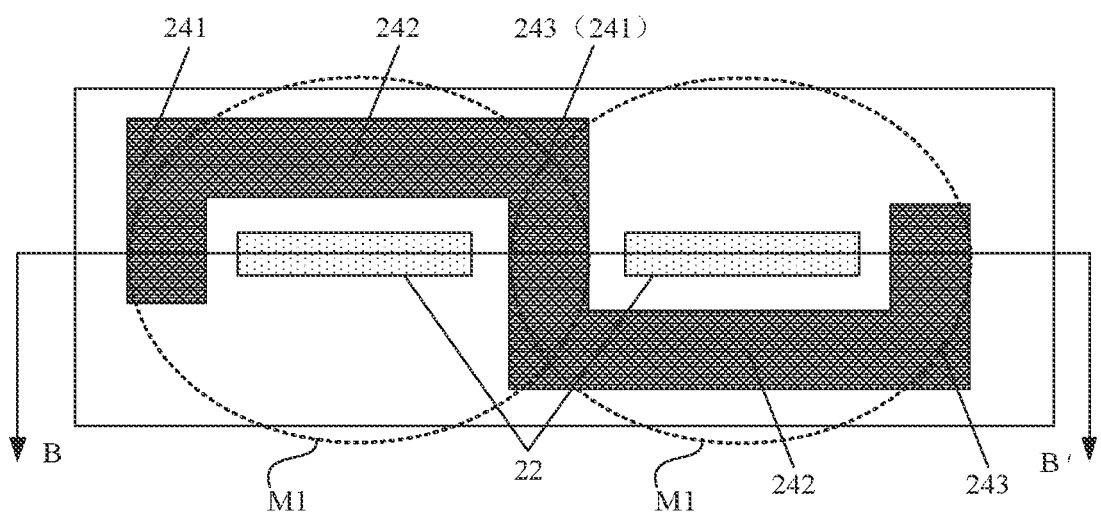
FIG. 13B is a top view of a display substrate, in accordance with some embodiments of the present disclosure.
Figure 13C:
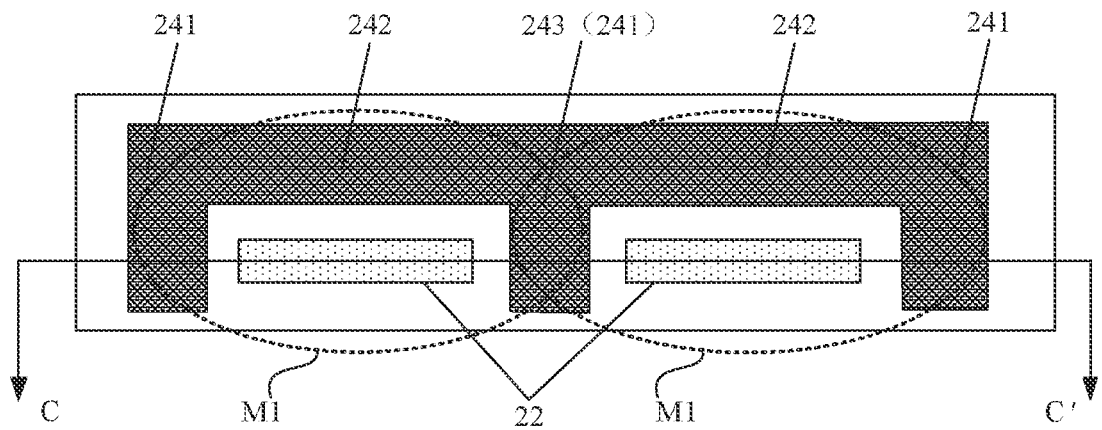
FIG. 13C is a top view of another display substrate, in accordance with some embodiments of the present disclosure.

In some embodiments, as shown in FIGS. 13B and 13C, the gate 24 of the first thin film transistor M1 includes a first gate portion 241, a second gate portion 242, and a third gate portion 243 that form a one-piece structure. The first gate portion 241, the second gate portion 242, and the third gate portion 243 are located at a first side, a second side and a third side of the active pattern 22, respectively. The first side and the second side are two adjacent sides of the active pattern 22, and the first side and the third side are two opposite sides of the active pattern 22.

In this case, as shown in FIGS. 13B and 130, the third gate portion 243 of one of the two first thin film transistors M1 serves as the first gate portion 241 of another of the two first thin film transistors M1. In other words, the gates 24 of the two first thin film transistors M1 form a one-piece structure.

In some examples, as shown in FIG. 13B, orthogonal projections of the gates 24 of the two first thin film transistors M1 on the base substrate 1001 are in a shape of a capital letter S.

In some other examples, as shown in FIG. 130, the orthogonal projections of the gates 24 of the two first thin film transistors M1 on the base substrate 1001 are in a shape of a capital letter "E".

Of course, the structures of the gates 24 of the two first thin film transistors M1 shown in FIGS. 13B and 130 are only for illustration, and the gates 24 of the two first thin film transistors M1 may also be of other structures.

For example, the gate 24 of one first thin film transistor M1 only includes a first gate portion 241 and a second gate portion 242, and the gate 24 of another first thin film transistor M1 includes a first gate portion 241, a second gate portion 242 and a third gate portion 243; and the second gate portion 242 of the former is electrically connected to the first gate portion 241 of the latter.

For another example, the gate 24 of one first thin film transistor M1 only includes a first gate portion 241, which is located between the active patterns 22 of the two first thin film transistors Ml, and the gate 24 of another first thin film transistor M1 includes a first gate portion 241, a second gate portion 242, and a third gate portion 243; and the first gate portion 241 of the former is electrically connected to the first gate portion 241 of the latter.

With regard to the structure of the gate 24 of each first thin film transistor M1 there are no other limitations, as long as the gates 24 of the two first thin film transistors M1 can be electrically connected to each other.

In this way, only one signal line is needed to transmit signals to the two first thin film transistors M1, which reduces the number of signal lines needed.

In some embodiments, the display substrate 100 is an OLED display substrate. In this case, as shown in FIG. 11B, the at least one thin film transistor M further includes a second thin film transistor M2. The second thin film transistor M2 serves as a switching transistor of the pixel circuit, and the plurality of first thin film transistors M1 connected in parallel collectively serve as a driving transistor of the pixel circuit.

Since the OLED display substrate requires a large on-state current of the driving transistor, by arranging that the driving transistor includes a plurality of first thin film transistors M1 connected in parallel, it may be possible to better meet the requirement of the OLED display substrate for the on-state current of the driving transistor.

It will be understood by those skilled in the art that, a width-to-length ratio of a channel of the driving transistor is greater than a width-to-length ratio of a channel of a transistor functioning as a switch.

Figure 14:
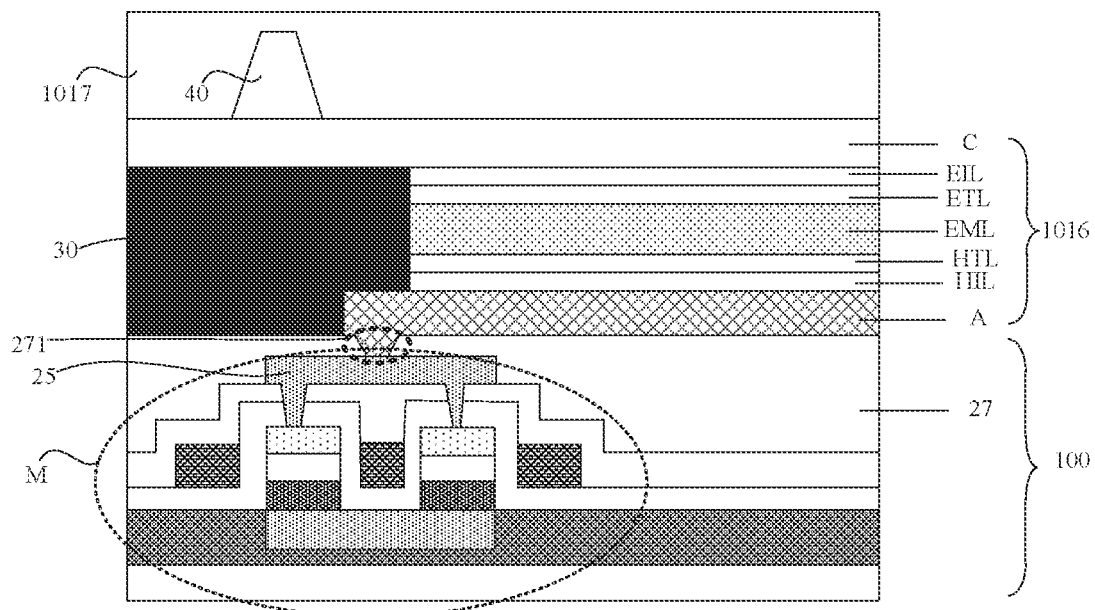
FIG. 14 is a schematic structural diagram of a display device, in accordance with some embodiments of the present disclosure.

Some embodiments of the present disclosure provide a display device 1. As shown in FIG. 14, the display device 1 includes the display substrate 100 as described above.

In some examples, the display device 1 further includes a plurality of light emitting-devices 1016 disposed on the display substrate 100, and each light-emitting device 1016 is correspondingly disposed in a sub-pixel region 1000.

As shown in FIG. 14, the light-emitting device 1016 may be electrically connected to the second electrode 25 of the thin film transistor M used as the driving transistor through at least one fourth via 271 provided in the planarization layer 27 of the display substrate 100.

For example, as shown in FIG. 14, the light-emitting device 1016 includes an anode (A), a hole injection layer (HIL), and a hole transport layer (HTL), an emitting material layer (EML), an electron transport layer (ETL), an electron injection layer (EIL), and a cathode (C) that are sequentially stacked in the thickness direction of the base substrate 1001. The anode A of the light-emitting device 1016 is electrically connected to the second electrode 25 of the thin film transistor M through the at least one fourth via 271 in the planarization layer 27.

It will be understood that, as shown in FIG. 14, in the display device 1, a pixel defining structure 30 is provided between adjacent light-emitting devices 1016. The pixel defining structure 30 is used for defining a space for each sub-pixel region 1000, thereby avoiding light mixing of light emitted by adjacent light-emitting devices 1016.

As shown in FIG. 14, in order to prevent the light-emitting devices 1016 and the thin film transistors M from being damaged by pressure, the display device 1 further includes support columns 40 located on a side of the light-emitting devices 1016 away from the base substrate 1001, and an encapsulation structure 1017 located on a side of the support columns 40 away from the base substrate 1001.

For example, the encapsulation structure 1017 may be a thin film encapsulation layer or an encapsulation substrate, which is not limited here.

Figure 15:
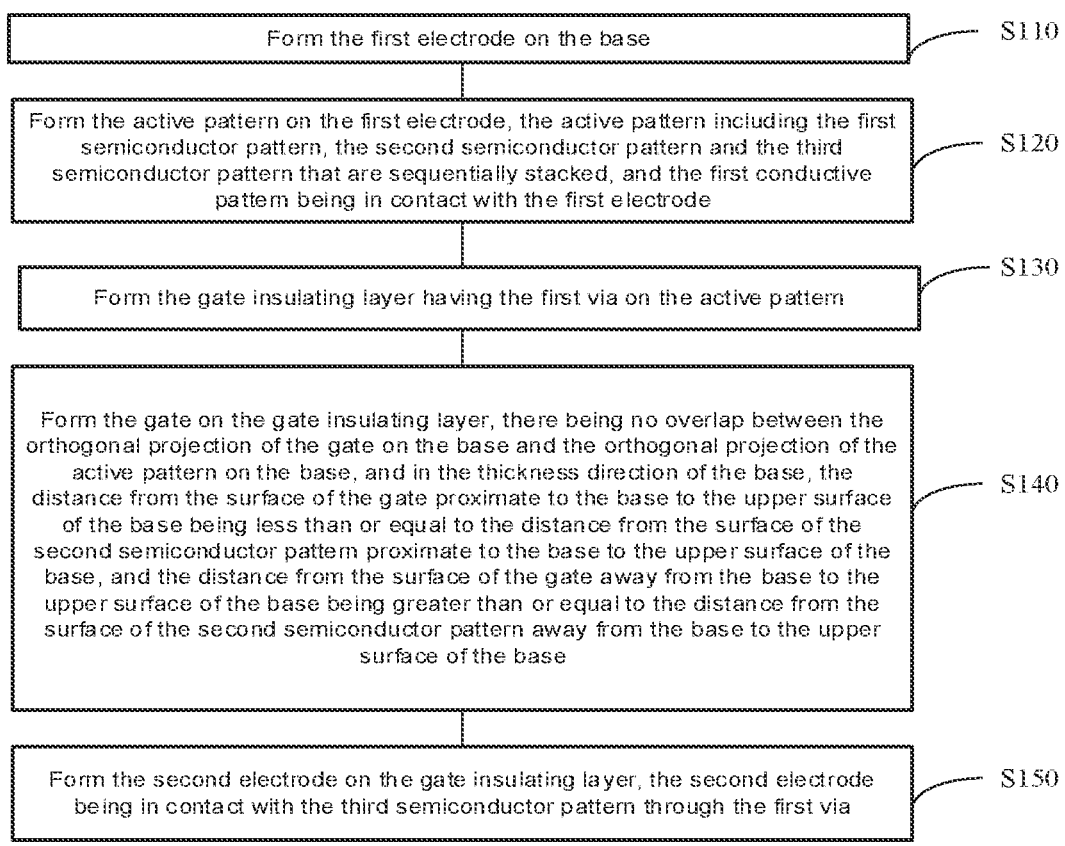
FIG. 15 is a flow diagram of a method of manufacturing a thin film transistor, in accordance with some embodiments of the present disclosure.

Some embodiments of the present disclosure provide a method of manufacturing a thin film transistor M, which is used for manufacturing the thin film transistor M as describe above. As shown in FIG. 15, the method includes steps 110 to 150 (S110 150).

In 5110, as shown in FIG. 5, the first electrode 21 is formed on the base 20.

A thickness of the first electrode 21 is within a range of 400 nm to 800 nm, for example, 400 nm, 500 nm, 550 nm, 600 nm, 650 nm, 700 nm, 750 nm, or 800 nm.

The first electrode 21 may be of a single-layer metal structure or a multi-layer metal structure. For example, the first electrode 21 includes a titanium (Ti) metal layer, an aluminum (Al) metal layer, and another titanium (Ti) metal layer that are stacked. A thickness of the titanium metal layer is, for example, 50 nm, and a thickness of the aluminum metal layer is, for example, 650 nm.

Figure 16:
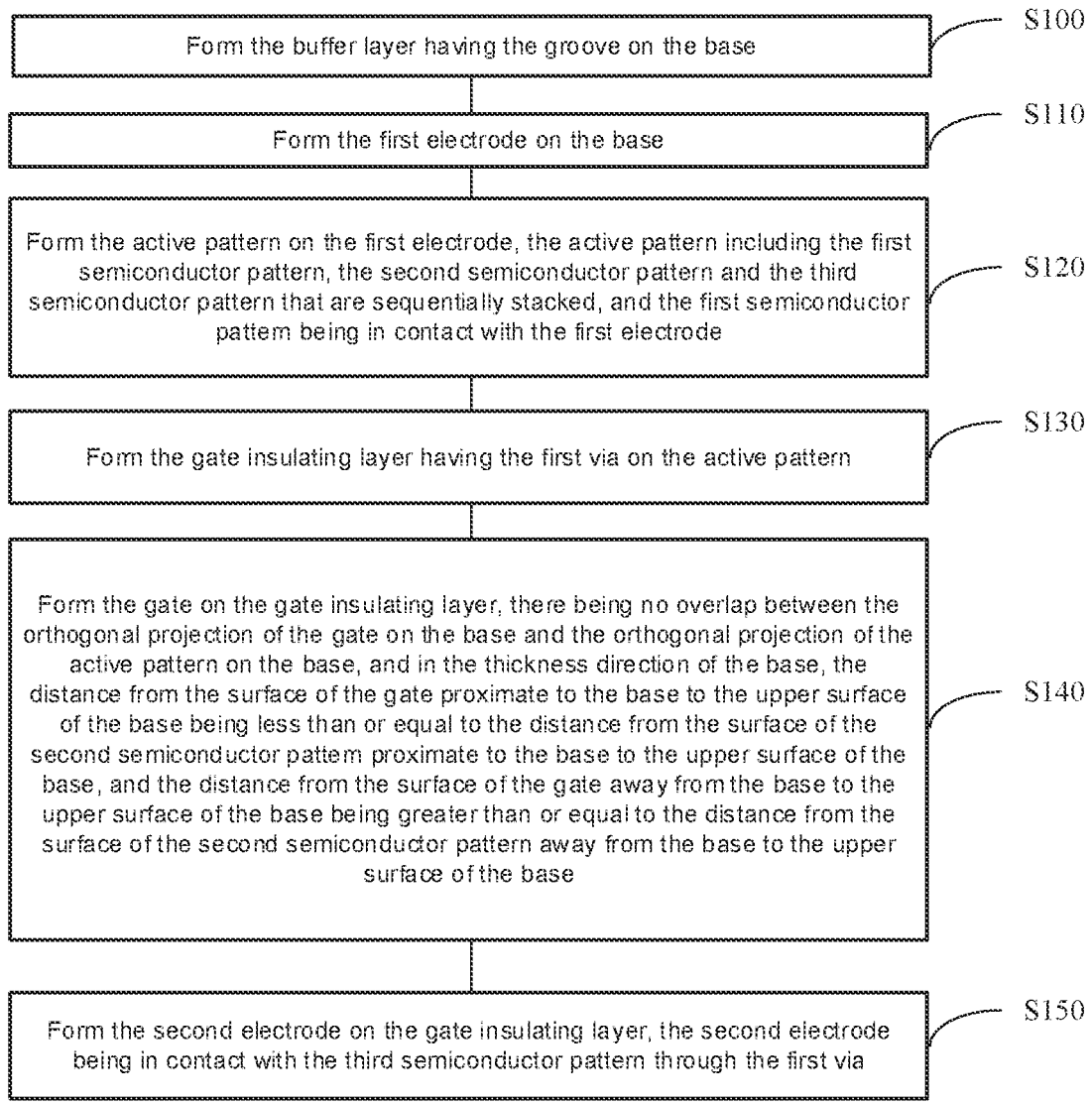
FIG. 16 is a flow diagram of another method of manufacturing a thin film transistor, in accordance with some embodiments of the present disclosure.

In some embodiments, before the first electrode 21 is formed on the base 20, as shown in FIG. 16, the method further includes step 100 (S100).

Figure 13D:
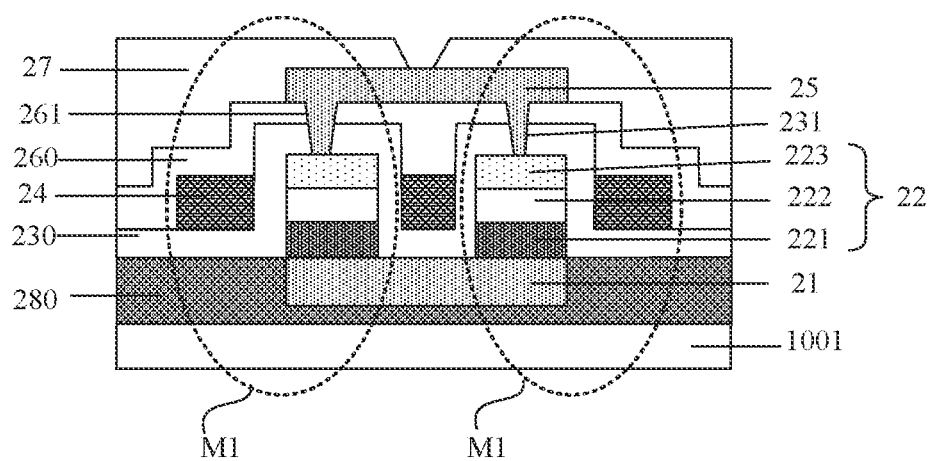
FIG. 13D is a sectional view taken along a B-B' direction in FIG. 13B or a C-C' direction in FIG. 13C.
Figure 13E:
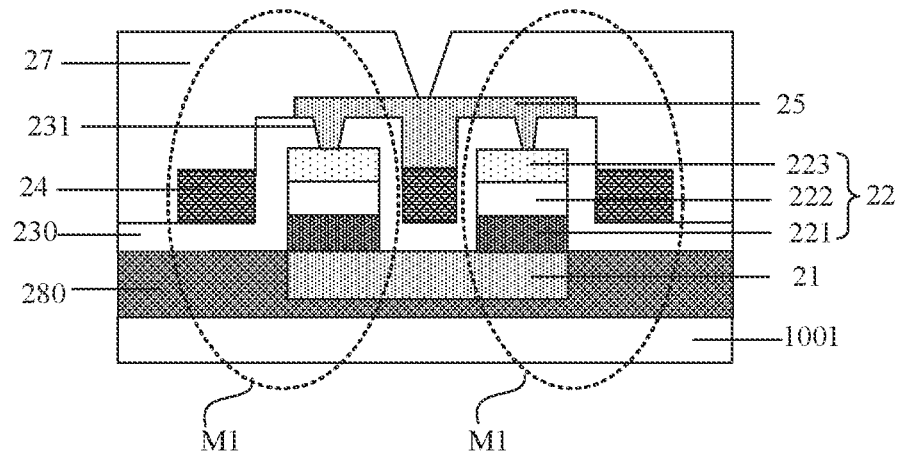
FIG. 13E is another sectional view taken along the B-B' direction in FIG. 13B or the C-C' direction in FIG. 13D.

In S100, as shown in FIGS. 13A, 13D and 13E, the buffer layer 28 having the groove 281 is formed on the base 20.

For example, a buffer layer film is formed on the base 20 by a chemical vapor deposition process, and a first patterning process is performed on the buffer layer film to form the buffer layer 28 having the groove 281.

A material of the buffer layer 28 may be an inorganic material, such as silicon nitride ($SiN_x$) or silicon oxide ($SiO_2$).

In this case, the step of forming the first electrode 21 on the base 20 in 5110 includes: forming the first electrode 21 in the groove 281 of the buffer layer 28.

For example, a first conductive film is formed on the buffer layer 28 by a magnetron sputtering process, and a second patterning process is performed on the first conductive film to form the first electrode 21 located in the groove 281.

In S120, as shown in FIG. 5, the active pattern 22 is formed on the first electrode 21. The active pattern 22 includes the first semiconductor pattern 221, the second semiconductor pattern 222, and the third semiconductor pattern 223 that are sequentially stacked. The first semiconductor pattern 221 is in contact with the first electrode 21.

The material of the second semiconductor pattern 222 includes the semiconductor material, the material of one of the first semiconductor pattern 221 and the third semiconductor pattern 223 includes the semiconductor material and the N-type doped ions, and the material of another of the first semiconductor pattern 221 and the third semiconductor pattern 223 includes the semiconductor material and the P-type doped ions. For example, the first semiconductor pattern 221 is an N-type doped pattern, and the third semiconductor pattern 223 is a P-type doped pattern. Alternatively, the first semiconductor pattern 221 is a P-type doped pattern, and the third semiconductor pattern 223 is an N-type doped pattern.

For example, a manufacturing process of the active pattern 22 is as follows. First, a first semiconductor film is formed, and the first semiconductor film is doped with ions. Then, a second semiconductor film and a third semiconductor film are sequentially formed, and the third semiconductor film is doped with ions, Finally, a third patterning process is performed on the second semiconductor film, the doped first semiconductor film and the doped third semiconductor film as a whole to form the first semiconductor pattern 221, the second semiconductor pattern 222 and the third semiconductor pattern 223 that are stacked.

Materials of the first semiconductor film, the second semiconductor film and the third semiconductor film are the same. For example, they are all gallium arsenide (GaAs) films; or, they are all low-temperature polysilicon films.

In S130, as shown in FIG. 5, the gate insulating layer 23 having the first via 231 is formed on the active pattern 22.

For example, a first insulating film is formed by a plasma enhanced chemical vapor deposition (PECVD) process, and a fourth patterning process is performed on the first insulating film to form the gate insulating layer 23 having the first via 231.

It will be understood that, the first via 231 in the gate insulating layer 23 may be formed after the gate 24 is formed, or may be formed before the gate 24 is formed. The specific order herein is related to the manufacturing process of the thin film transistor M, which is not limited, as long as the gate 24 and the active pattern 22 are insulated from each other.

In S140, as shown in FIG. 5, the gate 24 is formed on the gate insulating layer 23. There is no overlap between the orthogonal projection of the gate 24 on the base 20 and the orthogonal projection of the active pattern 22 on the base 20. In the thickness direction of the base 20, the distance h1 from the surface of the gate 24 proximate to the base 20 to the upper surface of the base 20 is less than or equal to the distance h2 from the surface of the second semiconductor pattern 222 proximate to the base 20 to the upper surface of the base 20. The distance h3 from the surface of the gate 24 away from the base 20 to the upper surface of the base 20 is greater than or equal to the distance h4 from the surface of the second semiconductor pattern 222 away from the base 20 to the upper surface of the base 20.

The upper surface of the base 20 is the surface of the base 20 proximate to the first electrode 21.

In other words, with a plane where a side of the gate 24 facing the active pattern 22 is located as a reference plane 241 (the reference plane 241 is perpendicular to the base 20), an orthogonal projection of the second semiconductor pattern 222 on the reference plane 241 is located within an orthogonal projection of the gate 24 on the reference plane 241. Therefore, a thickness of the gate 24 is determined such that the orthogonal projection of the second semiconductor pattern 222 on the reference plane 241 is located within the orthogonal projection of the gate 24 on the reference plane 241.

The gate 24 may be obtained by forming a second conductive film through a magnetron sputtering process and then performing a fifth patterning process on the second conductive film.

The gate 24 may be of a single-layer metal structure or a multi-layer metal structure. For example, the gate 24 includes a molybdenum (Mo) metal layer.

In S150, as shown in FIG. 5 the second electrode 25 is formed on the gate insulating layer 23. The second electrode 25 is in contact with the third semiconductor pattern 223 through the first via 231.

The second electrode 25 may be obtained by forming a third conductive film through a magnetron sputtering process, and then performing a sixth patterning process on the third conductive film.

A thickness of the second electrode 25 is within a range of 200 nm to 300 nm, for example, 200 nm, 250 nm, or 300 nm.

The second electrode 25 may be of a single-layer metal structure or a multi-layer metal structure. For example, the second electrode 25 is a molybdenum (Mo) metal layer.

In some embodiments, after the gate 24 is formed and before the second electrode 25 is formed, the method further includes step 160 (S160).

In S160, as shown in FIGS. 13A and 13D, the interlayer insulating layer 26 having a third via 261 is formed on the gate 24. The third via 261 is communicated with the first via 261.

For example, a second insulating film is formed by a PECVD process, and a seventh patterning process is performed on the second insulating film to form the interlayer insulating layer 26 having the third via 261.

Each of the first to seventh patterning processes includes exposure, development, etching, and other processes, so as to form a corresponding pattern.

When the plurality of the thin film transistors M connected in parallel are formed using the above method, same pattern layers in the plurality of thin film transistors M may be formed through a single patterning process; and the first electrodes 21 of the plurality of thin film transistors M may be electrically connected, the second electrodes 25 of the plurality of thin film transistor M may be electrically connected, and the gates 24 of the plurality of thin film transistors M may be electrically connected. For example, the first electrodes 21 of the plurality of thin film transistors M form a one-piece structure, the second electrodes 25 of the plurality of thin film transistors M form a one-piece structure, and the gates 24 of the plurality of thin film transistors M form a one-piece structure.

Herein, referring to FIG. 13E, a description is given with manufacturing two thin film transistors M connected in parallel as an example.

Firstly, the one-piece buffer layer 280 having a groove 281 is formed on the base 20 through the first patterning process.

Secondly, two first electrodes 21 that form a one-piece structure are formed in the groove 281 through the second patterning process.

Thirdly, two active patterns 22 that are spaced apart from each other are formed on the two first electrodes 21 that form a one-piece structure through the third patterning process. Each active pattern 22 includes the first semiconductor pattern 221, the second semiconductor pattern 222 and the third semiconductor pattern 223 that are sequentially stacked. One of the first semiconductor pattern 221 and the third semiconductor pattern 223 is a P-type doped pattern, and another thereof is an N-type doped pattern.

Fourthly, the one-piece gate insulating layer 230 having two first vias 231 is formed on the two active patterns 22 that are spaced apart from each other through the fourth patterning process. The two first vias 231 correspond to the two active patterns 22, respectively.

Fifthly, two gates 24 that form a one-piece structure are formed on the one-piece gate insulating layer 230 through the fifth patterning process. There is no overlap between the orthogonal projections of the gates 24 on the base substrate 1001 and the orthogonal projections of the active patterns 22 on the base substrate 1001. The orthogonal projection of each gate 24 on the base substrate 1001 is in a shape of a capital letter "U", and the orthogonal projections of the two gates 24 on the base substrate 1001 are in a shape of a capital letter "E".

Finally, two second electrodes 25 that form a one-piece structure are formed on the one-piece gate insulating layer 230 through the sixth patterning process. Each second electrode 25 is in contact with a corresponding active pattern 22 through the first via 231.

The above descriptions are only specific implementations of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate having a plurality of sub-pixel regions, the display substrate comprising at least one thin film transistor disposed in a sub-pixel region in the plurality of sub-pixel regions, each thin film transistor including:
a base;
a first electrode disposed on the base;
an active pattern disposed on the first electrode, the active pattern including a first semiconductor pattern, a second semiconductor pattern and a third semiconductor pattern that are sequentially stacked in a thickness direction of the base, a material of the second semiconductor pattern including a semiconductor material, a material of one of the first semiconductor pattern and the third semiconductor pattern including the semiconductor material and N-type doped ions, and a material of another of the first semiconductor pattern and the third semiconductor pattern including the semiconductor material and P-type doped ions, the first semiconductor pattern being in contact with the first electrode;
a gate insulating layer disposed on the active pattern, at least one first via being provided in the gate insulating layer;
a gate disposed on the gate insulating layer, an orthogonal projection of the gate on the base being non-overlapping with an orthogonal projection of the active pattern on the base, a distance from a surface of the gate proximate to the base to an upper surface of the base being less than or equal to a distance from a surface of the second semiconductor pattern proximate to the base to the upper surface of the base, a distance from a surface of the gate away from the base to the upper surface of the base being greater than or equal to a distance from a surface of the second semiconductor pattern away from the base to the upper surface of the base, the upper surface of the base being a surface of the base proximate to the first electrode; and
a second electrode disposed on the gate insulating layer, the second electrode being in contact with the third semiconductor pattern through the at least one first via,
wherein the at least one thin film transistor includes two first thin film transistors connected in parallel,
wherein first electrodes of the two first thin film transistors are disposed in a same layer and electrically connected to each other, second electrodes of the two first thin film transistors are disposed in a same layer and electrically connected to each other, and gates of the two first thin film transistors are disposed in a same layer and electrically connected to each other.

2. The display substrate according to claim 1, wherein the gate includes a first gate portion located at a first side of the active pattern.

3. The display substrate according to claim 2, wherein the gate further includes a second gate portion located at a second side of the active pattern, and the first side and the second side are two adjacent sides of the active pattern; the first gate portion and the second gate portion form a one-piece structure.

4. The display substrate according to claim 3, wherein the gate further includes a third gate portion located at a third side of the active pattern, and the first side and the third side are two opposite sides of the active pattern; the first gate portion, the second gate portion and the third gate portion form a one-piece structure.

5. The display substrate according to claim 4, wherein the gate further includes a fourth gate portion located at a fourth side of the active pattern, and the second side and the fourth side are two opposite sides of the active pattern; the first gate portion, the second gate portion, the third gate portion, and the fourth gate portion form a one-piece structure.

6. The display substrate according to claim 1, wherein a side of the gate facing the active pattern is in contact with the gate insulating layer.

7. The display substrate according to claim 1, further comprising a buffer layer disposed between the first electrode and the base, wherein a groove is disposed in a surface of the buffer layer away from the base, and the first electrode is disposed in the groove.

8. The display substrate according to claim 7, wherein the buffer layer includes a first sub-layer and a second sub-layer, and the second sub-layer is disposed on a surface of the first sub-layer away from the base;
a second via is provided in the second sub-layer; the second via serves as the groove, and the first electrode is disposed in the second via.

9. The display substrate according to claim 1, further comprising an interlayer insulating layer disposed between the gate and the second electrode, wherein at least one third via is provided in the interlayer insulating layer;
the at least one third via is communicated with the at least one first via, respectively, and the second electrode is in contact with the third semiconductor pattern through the at least one third via and the at least one first via.

10. The display substrate according to claim 1, wherein the gate and the second electrode are disposed in a same layer.

11. The display substrate according to claim 1, wherein a gate of each first thin film transistor includes a first gate portion, a second gate portion and a third gate portion that form a one-piece structure;
the first gate portion, the second gate portion and the third gate portion are located at a first side, a second side and a third side of the active pattern, respectively;
a third gate portion of one of the two first thin film transistors serves as a first gate portion of another of the two first thin film transistors.

12. The display substrate according to claim 1, wherein the display substrate is an organic light-emitting diode (OLED) display substrate;
the at least one thin film transistor further includes a second thin film transistor, and the two first thin film transistors connected in parallel collectively serve as a driving transistor.

13. A display device, comprising the display substrate according to claim 1.

14. The display device according to claim 13, further comprising a light-emitting device disposed in the sub-pixel region.

15. A method of manufacturing the display substrate according to claim 1, the method comprising:
forming the first electrodes of the two first thin film transistors electrically connected to each other on the base;
forming active patterns of the two first thin film transistors on the first electrodes, each active pattern including the first semiconductor pattern, the semiconductor pattern and the third semiconductor pattern that are sequentially stacked, the material of the second semiconductor pattern including the semiconductor material, the material of one of the first semiconductor pattern and the third semiconductor pattern including the semiconductor material and the N-type doped ions, the material of another of the first semiconductor pattern and the third semiconductor pattern including the semiconductor material and the P-type doped ions, the first semiconductor pattern being in contact with a respective first electrode of the first electrodes;

forming the gate insulating layer having the two first vias on the active patterns, the two first vias corresponding to the active patterns of the two first thin film transistors, respectively;

forming the gates of the two first thin film transistors electrically connected to each other on the gate insulating layer, orthogonal projections of the gates on the base being non-overlapping with orthogonal projections of the active patterns on the base, the distance from the surface of the gate proximate to the base to the upper surface of the base being less than or equal to the distance from the surface of the second semiconductor pattern proximate to the base to the upper surface of the base, the distance from the surface of the gate away from the base to the lower surface of the base being greater than or equal to the distance from the surface of the second semiconductor pattern away from the base to the lower surface of the base, the upper surface of the base being the surface of the base proximate to the first electrodes; and forming the second electrodes of the two first thin film transistors electrically connected to each other on the gate insulating layer, the second electrodes of the two first thin film transistors being in contact with third semiconductor patterns of the two first thin film transistors through the two first vias, respectively.

16. The method according to claim 15, wherein the first electrodes of the two first thin film transistors form a one-piece structure, and before forming the first electrodes of the two first thin film transistors electrically connected to each other on the base, the method further comprises:

forming a buffer layer film on the base by a chemical vapor deposition process, and performing a first patterning process on the buffer layer film to form a buffer layer having a groove; and forming the first electrodes of the two first thin film transistors electrically connected to each other on the base, includes:

forming a first conductive film on the buffer layer by a magnetron sputtering process, and performing a second patterning process on the first conductive film to form the first electrodes of the two first thin film transistors located in the groove.

17. The method according to claim 15, wherein after forming the gates of the two first thin film transistors electrically connected to each other on the gate insulating layer and before forming the second electrodes of the two first thin film transistors electrically connected to each other, the method further comprises:

forming an interlayer insulating layer having two third vias on the gates of the two first thin film transistors by a plasma enhanced chemical vapor deposition process, the two third vias being communicated with the two third vias, respectively.

* * * * *